US011164890B2

United States Patent
Zhang et al.

(10) Patent No.: US 11,164,890 B2
(45) Date of Patent: Nov. 2, 2021

(54) CROSS-POINT ARRAY OF FERROELECTRIC FIELD EFFECT TRANSISTORS AND METHOD OF MAKING THE SAME

(71) Applicant: SANDISK TECHNOLOGIES LLC, Addison, TX (US)

(72) Inventors: Yanli Zhang, San Jose, CA (US); Johann Alsmeier, San Jose, CA (US); Fei Zhou, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/738,644

(22) Filed: Jan. 9, 2020

(65) Prior Publication Data
US 2021/0217775 A1    Jul. 15, 2021

(51) Int. Cl.
H01L 21/02 (2006.01)
H01L 27/11597 (2017.01)
(Continued)

(52) U.S. Cl.
CPC ...... *H01L 27/11597* (2013.01); *G11C 11/223* (2013.01); *H01L 27/11587* (2013.01); *H01L 29/6684* (2013.01); *H01L 29/78391* (2014.09)

(58) Field of Classification Search
CPC ....... H01L 21/31111; H01L 21/823885; H01L 27/092; H01L 27/11582; H01L 29/456;
(Continued)

(56) References Cited

U.S. PATENT DOCUMENTS

| 5,451,800 A | 9/1995 | Mohammad |
| 5,920,088 A | 7/1999 | Augusto |

(Continued)

OTHER PUBLICATIONS

Notification of Transmittal of the International Search Report and Written Opinion of the International Search Authority for International Patent Application No. PCT/US2020/034798, dated Sep. 29, 2020, 9 pages.

(Continued)

*Primary Examiner* — Meiya Li
(74) *Attorney, Agent, or Firm* — The Marbury Law Group PLLC

(57) ABSTRACT

A semiconductor structure includes layer stack structures laterally extending along a first horizontal direction and spaced apart from each other along a second horizontal direction by line trenches. Each of the layer stack structures includes at least one instance of a unit layer sequence that includes, from bottom to top or top to bottom, a doped semiconductor source strip, a channel-level insulating strip, and a doped semiconductor drain strip. Line trench fill structures are located within a respective one of the line trenches. Each of the line trench fill structures includes a laterally-alternating sequence of memory pillar structures and dielectric pillar structures. Each of the memory pillar structures includes a gate electrode, at least one pair of ferroelectric dielectric layers, and at least one pair of vertical semiconductor channels located at each level of the channel-level insulating strips.

14 Claims, 26 Drawing Sheets

(51) Int. Cl.
*H01L 27/11587* (2017.01)
*G11C 11/22* (2006.01)
*H01L 29/66* (2006.01)
*H01L 29/78* (2006.01)

(58) Field of Classification Search
CPC .......... H01L 21/3105; H01L 27/10873; H01L 27/11556; H01L 29/165; H01L 29/66666; H01L 29/7827; H01L 29/78618; H01L 29/78642; H01L 29/78651; H01L 29/78684; H01L 49/003
See application file for complete search history.

(56) References Cited

U.S. PATENT DOCUMENTS

| | | | |
|---|---|---|---|
| 6,121,642 | A | 9/2000 | Newns |
| 8,097,498 | B2 | 1/2012 | Purayath et al. |
| 8,823,076 | B2 | 9/2014 | Lee et al. |
| 8,853,765 | B2 | 10/2014 | Lee et al. |
| 8,981,457 | B2 | 3/2015 | Lee et al. |
| 9,171,857 | B2 | 10/2015 | Lee et al. |
| 9,559,110 | B2 | 1/2017 | Lee |
| 9,941,299 | B1 | 4/2018 | Chen et al. |
| 10,008,511 | B2 | 6/2018 | Lee |
| 10,121,553 | B2 * | 11/2018 | Harari ................. G11C 16/3431 |
| 10,199,434 | B1 | 2/2019 | Lee et al. |
| 10,381,366 | B1 | 8/2019 | Takahashi et al. |
| 2013/0078776 | A1 | 3/2013 | Kim et al. |
| 2019/0288192 | A1 | 9/2019 | Takahashi et al. |
| 2020/0006431 | A1 | 1/2020 | Mayuzumi et al. |

OTHER PUBLICATIONS

U.S. Appl. No. 16/436,185, filed Jun. 10, 2019, SanDisk Technologies LLC.
U.S. Appl. No. 16/412,764, filed May 15, 2019, SanDisk Technologies LLC.
U.S. Appl. No. 16/410,376, filed May 13, 2019, SanDisk Technologies LLC.
U.S. Appl. No. 16/410,326, filed May 13, 2019, SanDisk Technologies LLC.
U.S. Appl. No. 16/291,673, filed Mar. 4, 2019, SanDisk Technologies LLC.
U.S. Appl. No. 16/249,300, filed Jan. 16, 2019, SanDisk Technologies LLC.
U.S. Appl. No. 16/530,256, filed Aug. 2, 2019, SanDisk Technologies LLC.
U.S. Appl. No. 16/457,687, filed Jun. 28, 2019, SanDisk Technologies LLC.
U.S. Appl. No. 16/227,889, filed Dec. 20, 2018, SanDisk Technologies LLC.
U.S. Appl. No. 16/737,088, filed Jan. 8, 2020, SanDisk Technologies LLC.
U.S. Appl. No. 16/728,825, filed Dec. 27, 2019, SanDisk Technologies LLC.
U.S. Appl. No. 16/707,036, filed Dec. 9, 2019, SanDisk Technologies LLC.
U.S. Appl. No. 16/694,340, filed Nov. 25, 2019, SanDisk Technologies LLC.
U.S. Appl. No. 16/577,176, filed Sep. 20, 2019, SanDisk Technologies LLC.
U.S. Appl. No. 16/539,124, filed Aug. 13, 2019, SanDisk Technologies LLC.
U.S. Appl. No. 16/539,103, filed Aug. 13, 2019, SanDisk Technologies LLC.
U.S. Appl. No. 16/541,289, filed Aug. 15, 2019, SanDisk Technologies LLC.
U.S. Appl. No. 16/568,668, filed Sep. 12, 2019, SanDisk Technologies LLC.
U.S. Appl. No. 16/456,736, filed Jun. 28, 2019, SanDisk Technologies LLC.
U.S. Appl. No. 16/454,475, filed Jun. 27, 2019, SanDisk Technologies LLC.
U.S. Appl. No. 16/454,458, filed Jun. 27, 2019, SanDisk Technologies LLC.

* cited by examiner

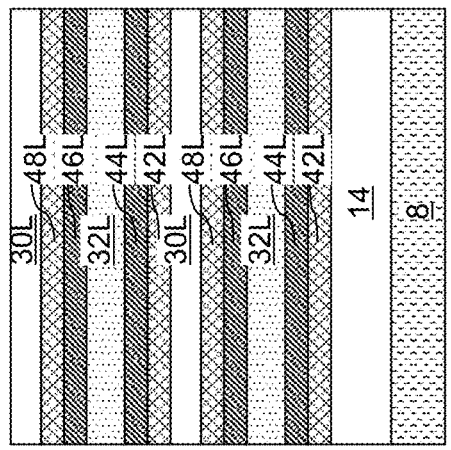
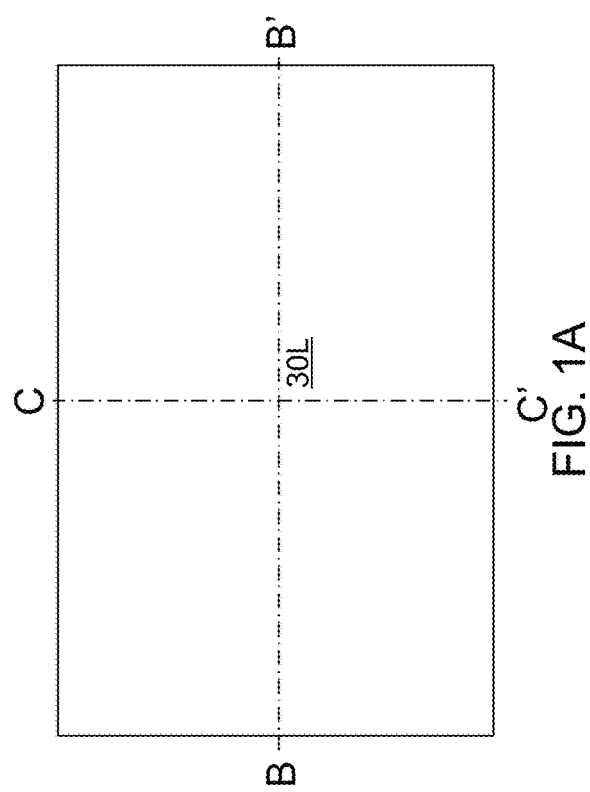
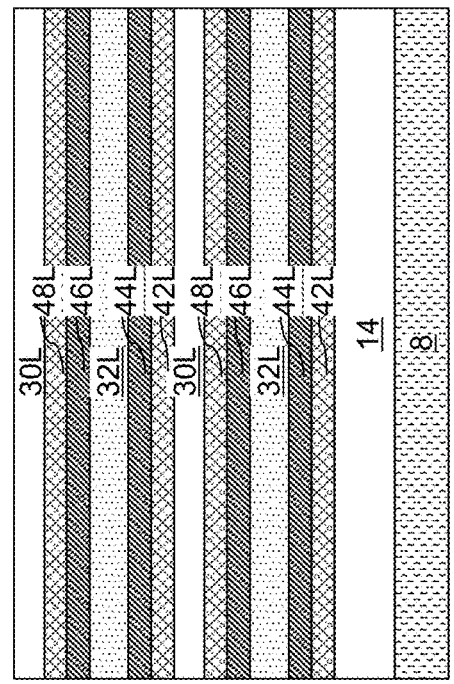

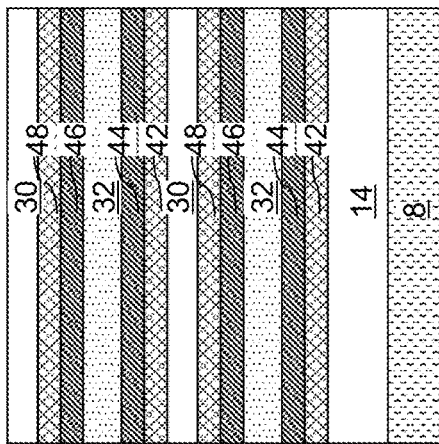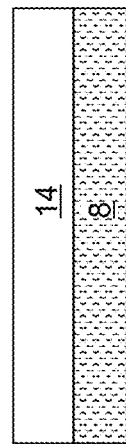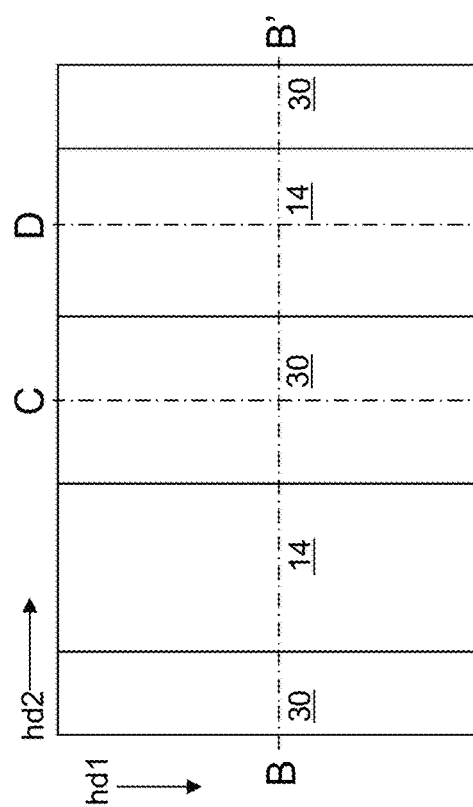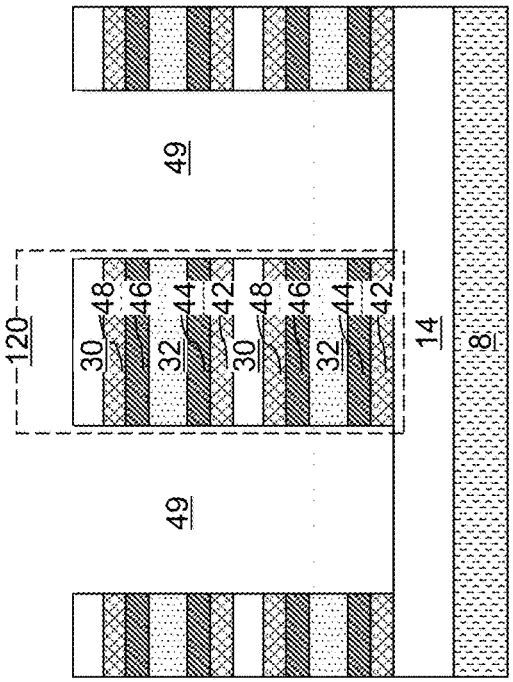

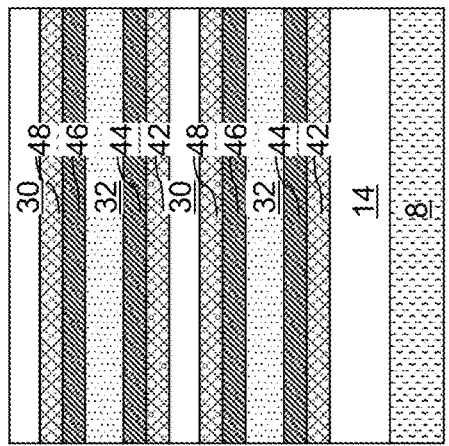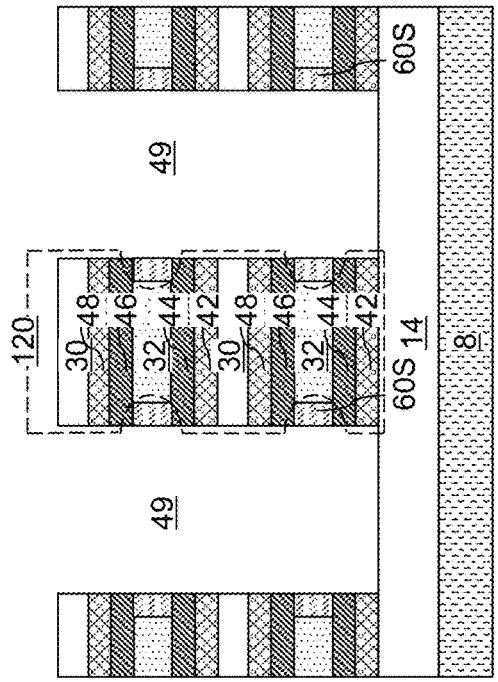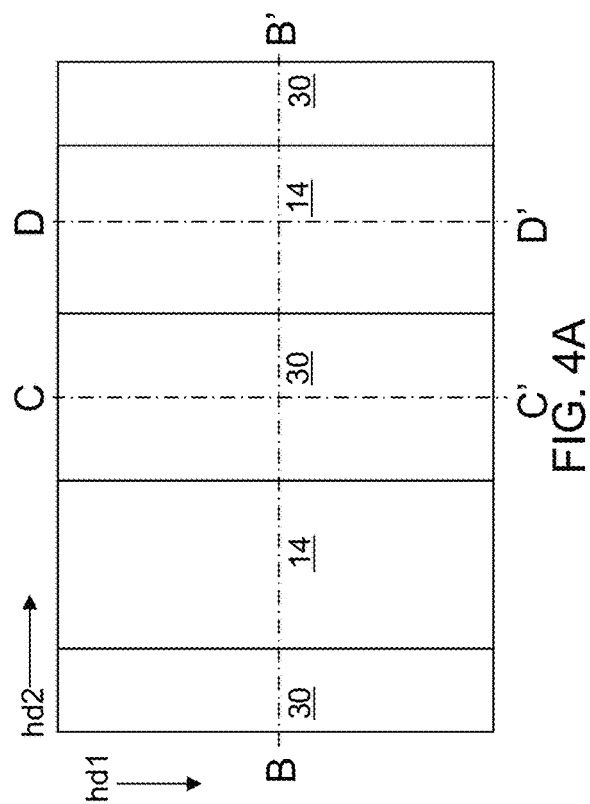
FIG. 4A
FIG. 4B
FIG. 4C
FIG. 4D

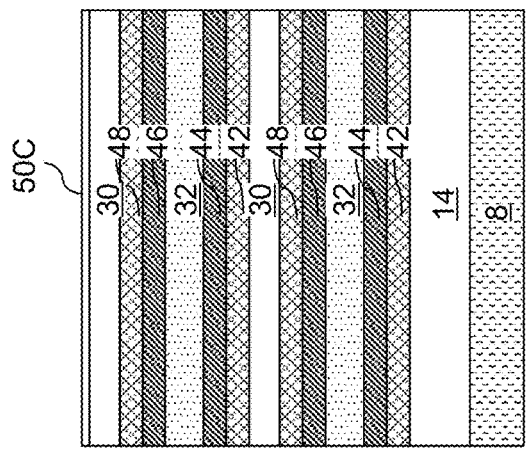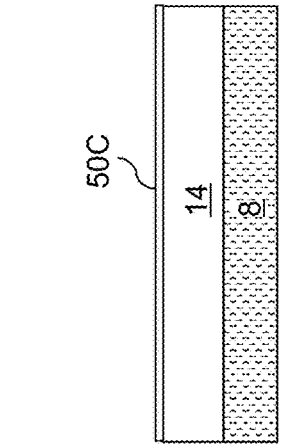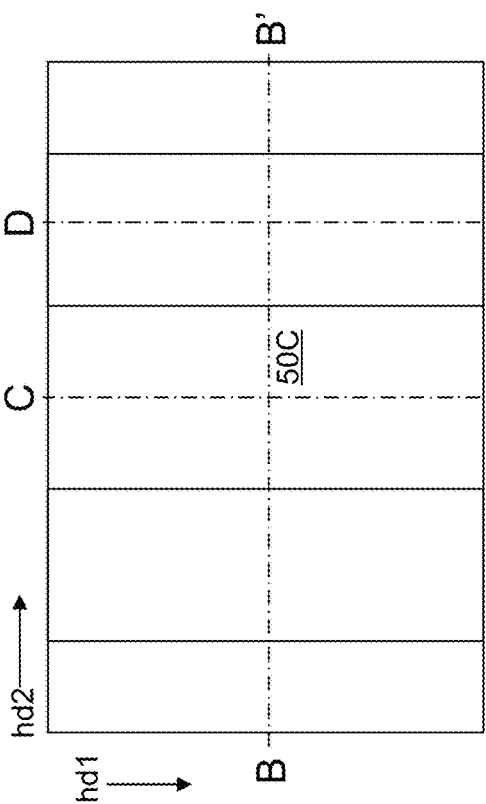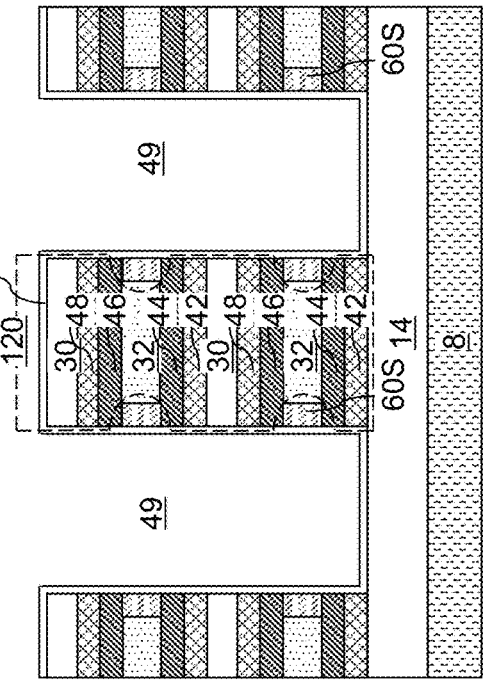

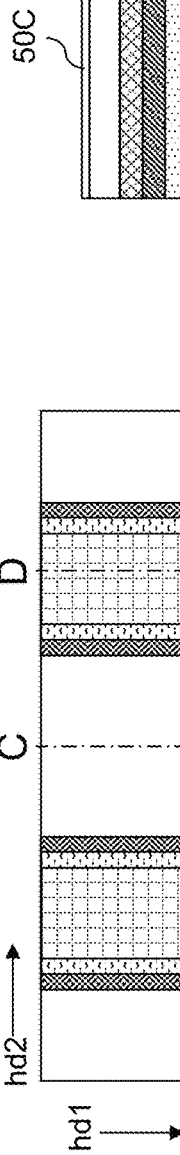
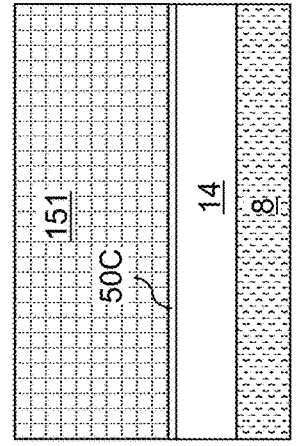
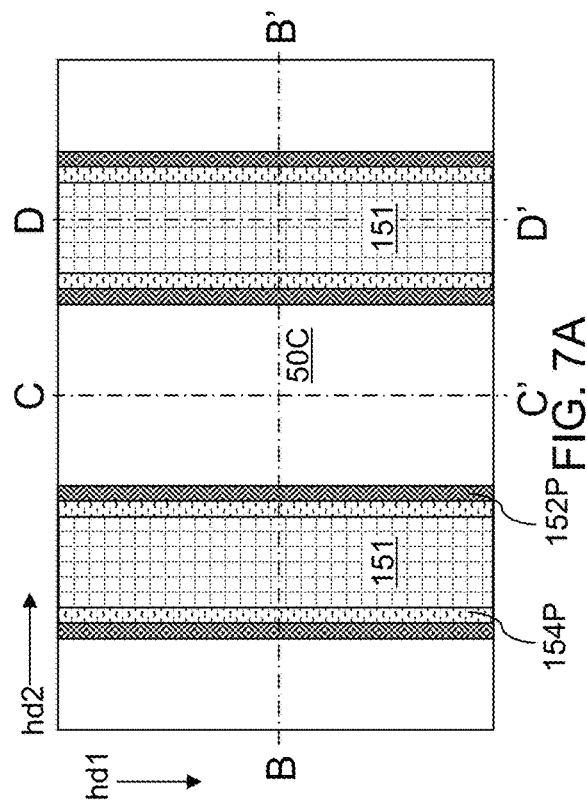
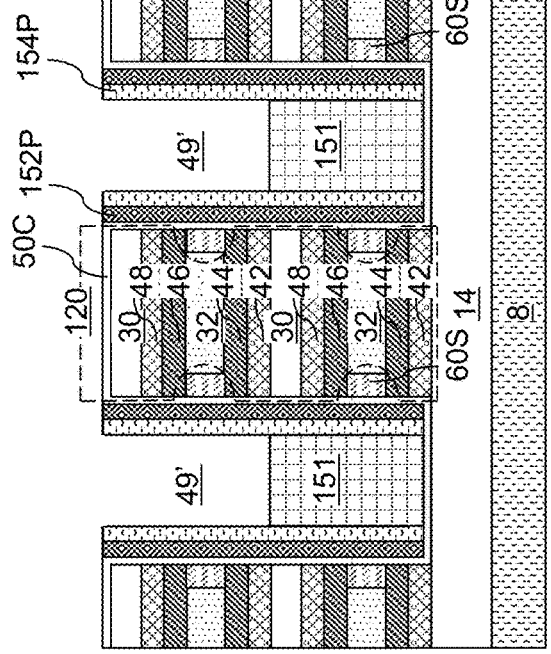

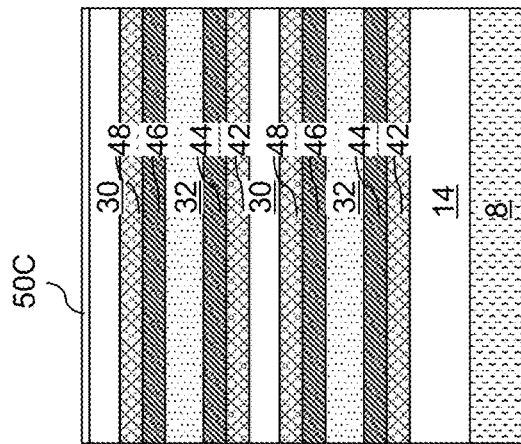
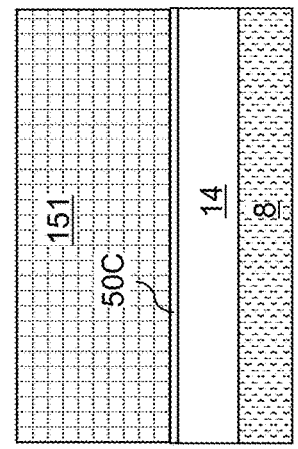
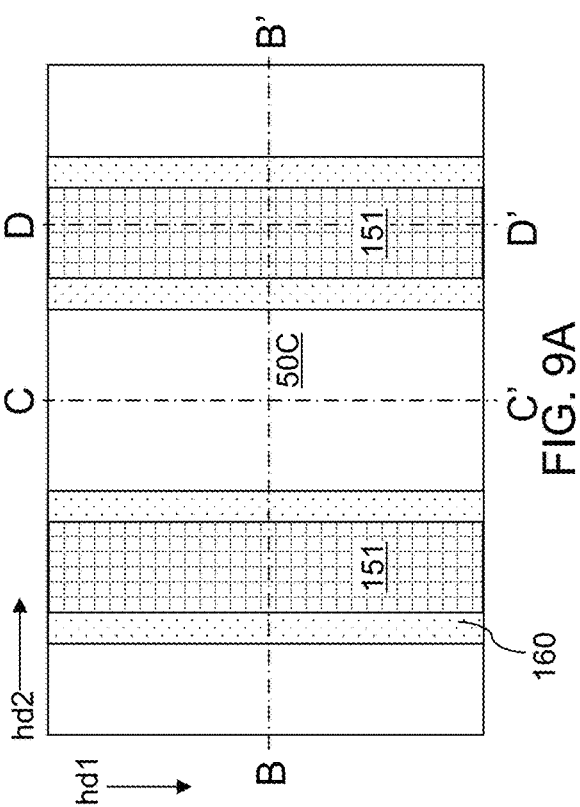
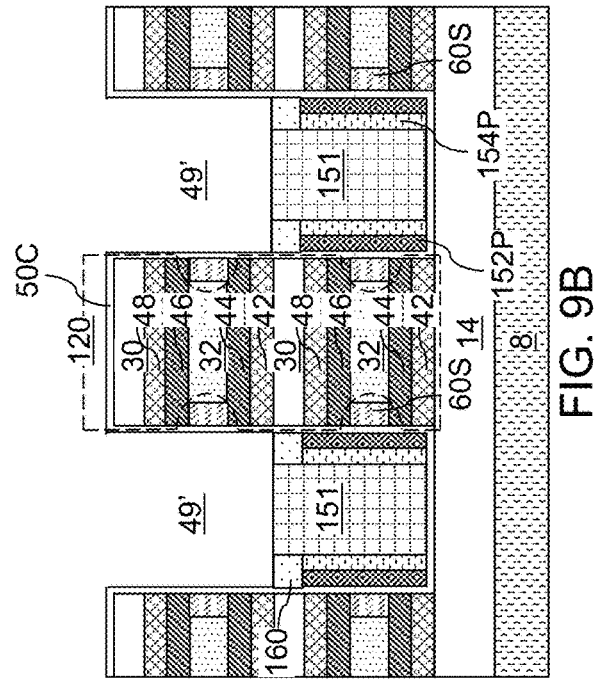

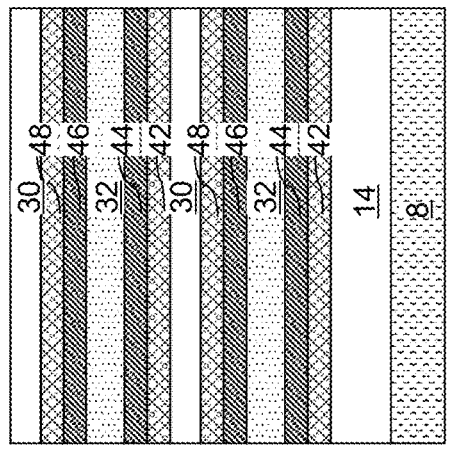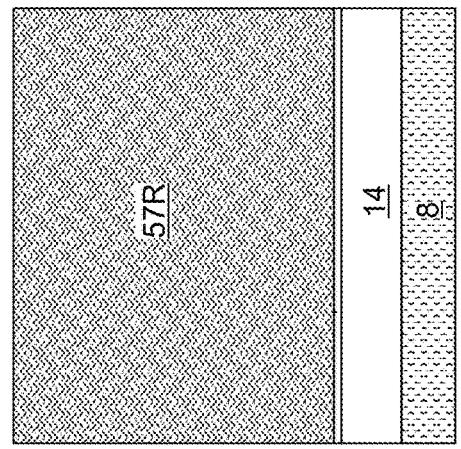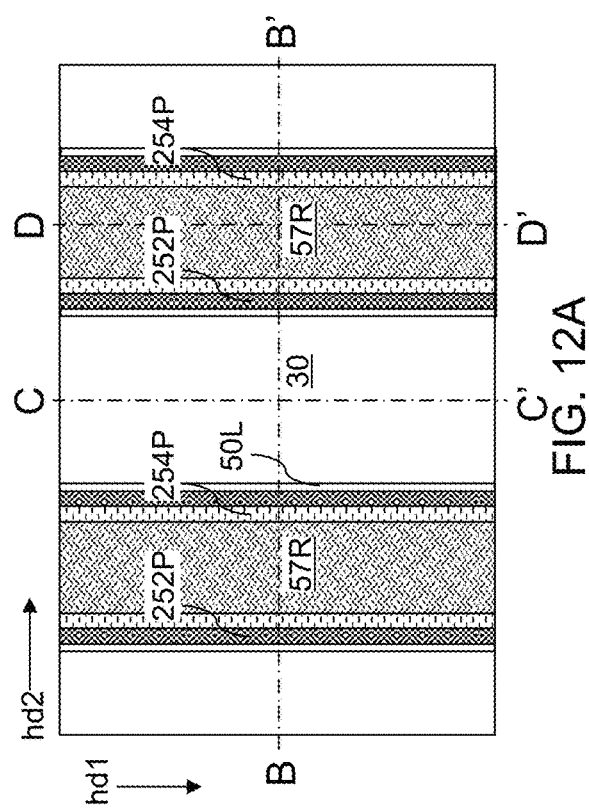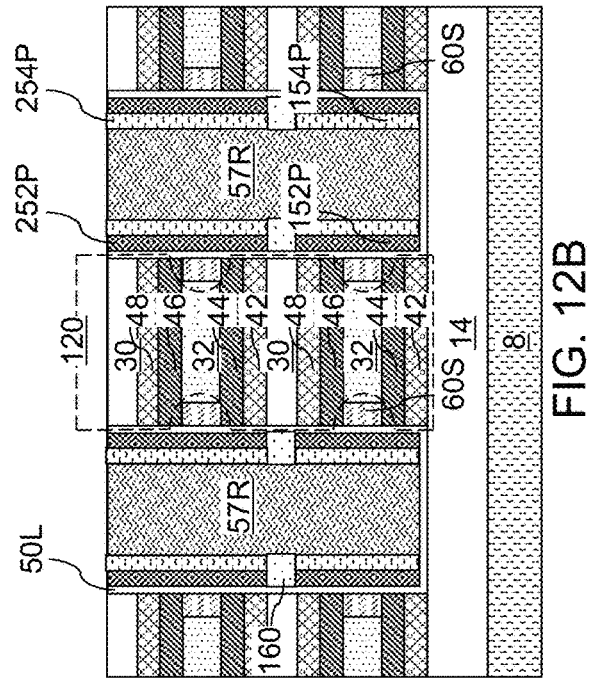

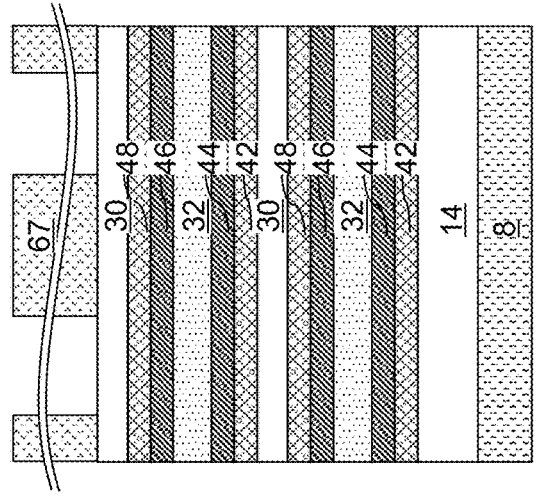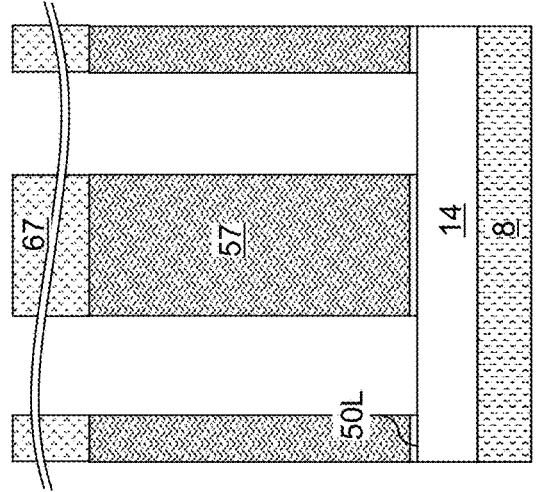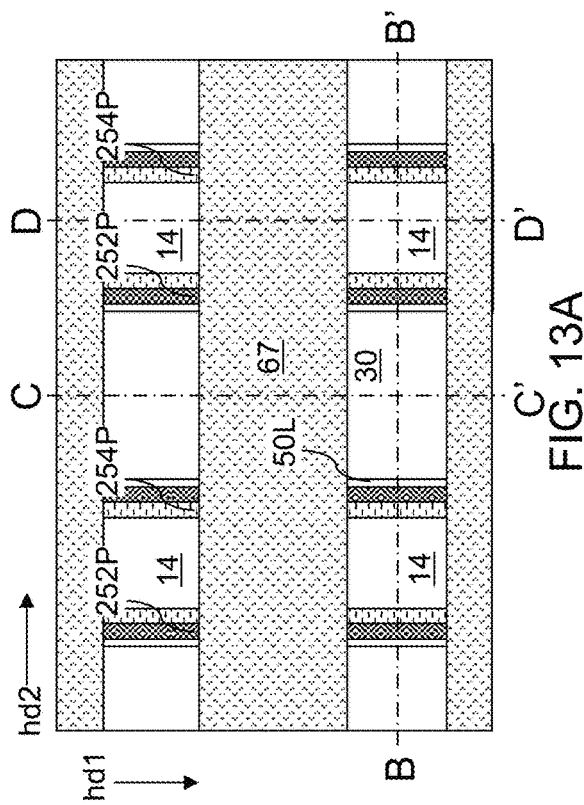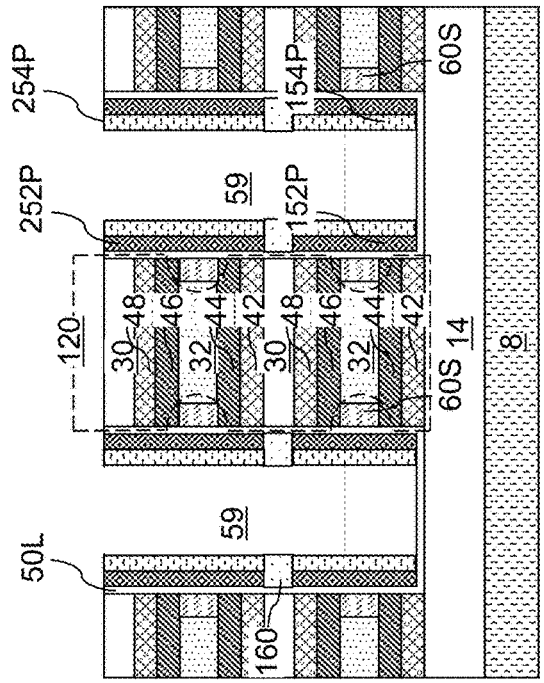

CROSS-POINT ARRAY OF FERROELECTRIC FIELD EFFECT TRANSISTORS AND METHOD OF MAKING THE SAME

FIELD

The present disclosure relates generally to the field of semiconductor devices, and particularly to a cross-point array of ferroelectric field effect transistors and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material. For example, the orientation of the dipole moment may be detected by measuring electrical current passing through a semiconductor channel provided adjacent to the ferroelectric material in a field effect transistor ferroelectric memory device.

SUMMARY

According to an aspect of the present disclosure, a semiconductor structure is provided, which comprises: layer stack structures laterally extending along a first horizontal direction and spaced apart from each other along a second horizontal direction by line trenches, wherein each of the layer stack structures comprises at least one instance of a unit layer sequence that includes, from bottom to top or top to bottom, a doped semiconductor source strip, a channel-level insulating strip, and a doped semiconductor drain strip; and line trench fill structures located within a respective one of the line trenches, wherein each of the line trench fill structures comprises a laterally-alternating sequence of memory pillar structures and dielectric pillar structures, and wherein each of the memory pillar structures comprises a gate electrode, at least one pair of ferroelectric dielectric layers, and at least one pair of vertical semiconductor channels located at each level of the channel-level insulating strips.

According to another aspect of the present disclosure, a method of forming a semiconductor structure is provided, which comprises: forming layer stack structures laterally extending along a first horizontal direction and spaced apart from each other along a second horizontal direction by line trenches, wherein each of the layer stack structures comprises at least one instance of a unit layer sequence that includes, from bottom to top or top to bottom, a doped semiconductor source strip, a channel-level insulating strip, and a doped semiconductor drain strip; forming an in-process line trench fill structure comprising at least one pair of semiconductor channel material strips, a pair of ferroelectric dielectric plates, and a sacrificial fill material rail within each line trench; dividing each in-process line trench fill structure into a row of in-process memory pillar structures by etching pillar cavities through each in-process line trench fill structure; forming dielectric pillar structures in the pillar cavities; and replacing remaining portions of the sacrificial fill material rails with gate electrodes, whereby a memory pillar structure comprising a gate electrode, at least one pair of ferroelectric dielectric layers, and at least one pair of vertical semiconductor channels is formed in each volume of the in-process memory pillar structures.

BRIEF DESCRIPTION OF THE DRAWINGS

With the drawings of the present disclosure, figures with a same figure numeral refer to a same structure. Each figure with an alphabetical figure suffix A is a top-down view, i.e., a plan view. For example, FIGS. 1A, 2A, 3A, etc. are top-down views. Each figure with an alphabetical suffix B is a vertical cross-sectional view along the vertical plane B-B' in the figure within the same figure numeral and with the alphabetical suffix A. Each figure with an alphabetical suffix C is a vertical cross-sectional view along the vertical plane C-C' in the figure within the same figure numeral and with the alphabetical suffix A. Each figure with an alphabetical suffix D is a vertical cross-sectional view along the vertical plane D-D' in the figure within the same figure numeral and with the alphabetical suffix A. Each figure with an alphabetical suffix E is a vertical cross-sectional view along the vertical plane E-E' in the figure within the same figure numeral and with the alphabetical suffix A. For example, FIG. 2B is a vertical cross-sectional view along the plane B-B' of FIG. 2A, FIG. 2C is a vertical cross-sectional view along the plane C-C' of FIG. 2A, and FIG. 2D is a vertical cross-sectional view along the plane D-D' of FIG. 1A. The structure of FIGS. 1A-1C are illustrated with a top-down view and two vertical cross-sectional views, some other structures are illustrated with a top-down view and three vertical cross-sectional views, and still other structures are illustrated with a top-down view and four vertical cross-sectional views.

FIGS. 1A, 1B, and 1C are various views of an exemplary structure after formation of multiple instances of a unit layer sequence that includes, from bottom to top, a metallic source layer, a doped semiconductor source layer, a channel-level insulating layer, a doped semiconductor drain layer, a metallic drain layer, and an inter-transistor-level insulating layer according to an embodiment of the present disclosure.

FIGS. 2A, 2B, 2C, and 2D are various views of the exemplary structure after formation of line trenches according to an embodiment of the present disclosure.

FIGS. 4A, 4B, 4C, and 4D are various views of the exemplary structure after formation of semiconductor channel material strips according to an embodiment of the present disclosure.

FIGS. 5A, 5B, 5C, and 5D are various views of the exemplary structure after formation of a continuous gate dielectric layer according to an embodiment of the present disclosure.

FIGS. 7A, 7B, 7C, and 7D are various views of the exemplary structure after formation of sacrificial fill structures according to an embodiment of the present disclosure.

FIGS. 9A, 9B, 9C, and 9D are various views of the exemplary structure after formation of vertical dielectric spacers according to an embodiment of the present disclosure.

FIGS. 12A, 12B, 12C, and 12D are various views of the exemplary structure after formation of a sacrificial fill material rail within each line cavity according to an embodiment of the present disclosure.

FIGS. 13A, 13B, 13C, and 13D are various views of the exemplary structure after formation of an array of pillar cavities according to an embodiment of the present disclosure.

DETAILED DESCRIPTION

Figure 3C:
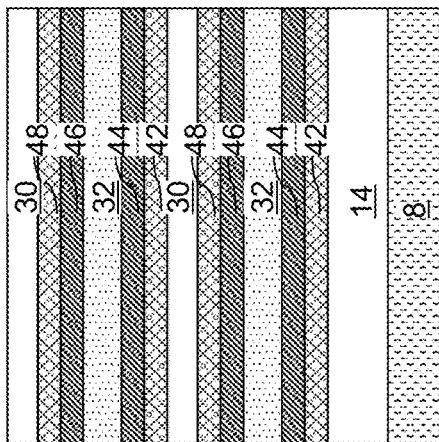
FIGS. 3A, 3B, 3C, and 3D are various views of the exemplary structure after formation of laterally-extending grooves according to an embodiment of the present disclosure.
Figure 3D:
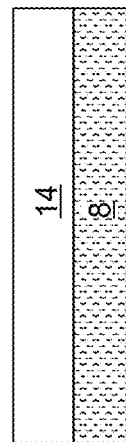
Figure 3A:
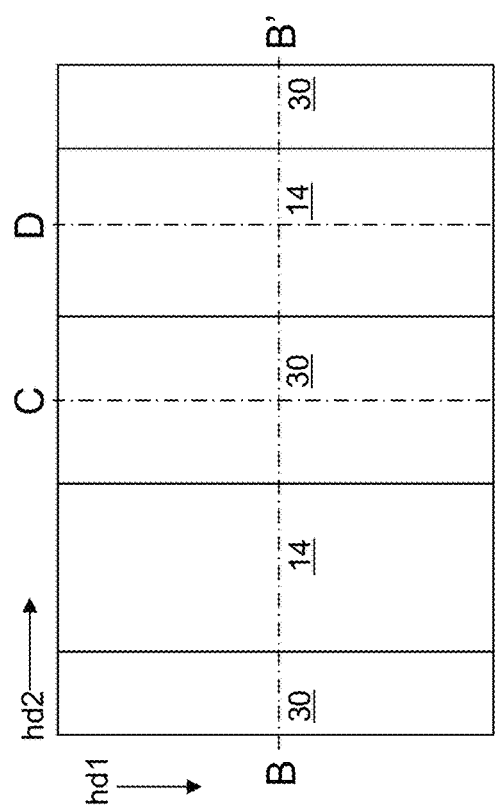
Figure 3B:
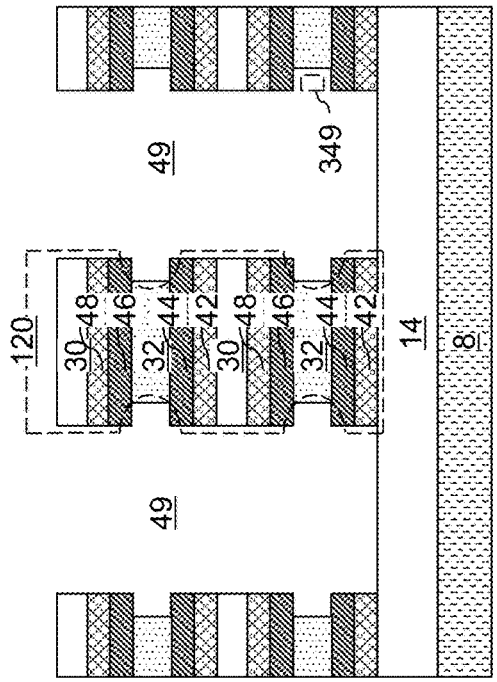
Figure 6C:
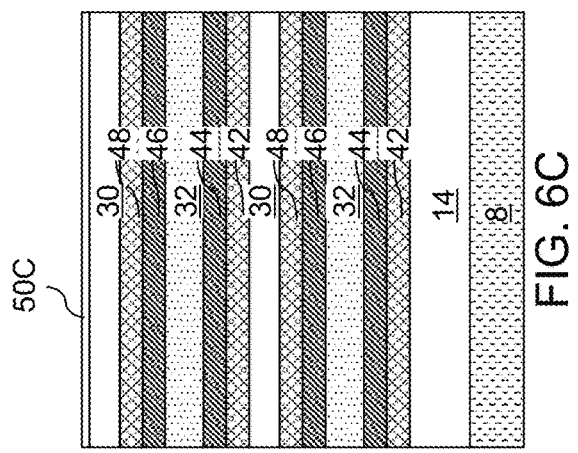
FIGS. 6A, 6B, 6C, and 6D are various views of the exemplary structure after formation of first metallic liner plates and first ferroelectric dielectric plates according to an embodiment of the present disclosure.
Figure 6D:
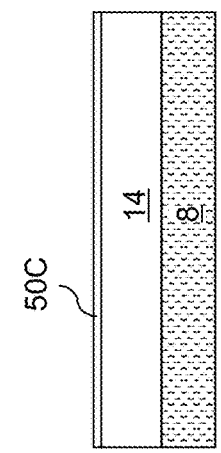
Figure 6A:
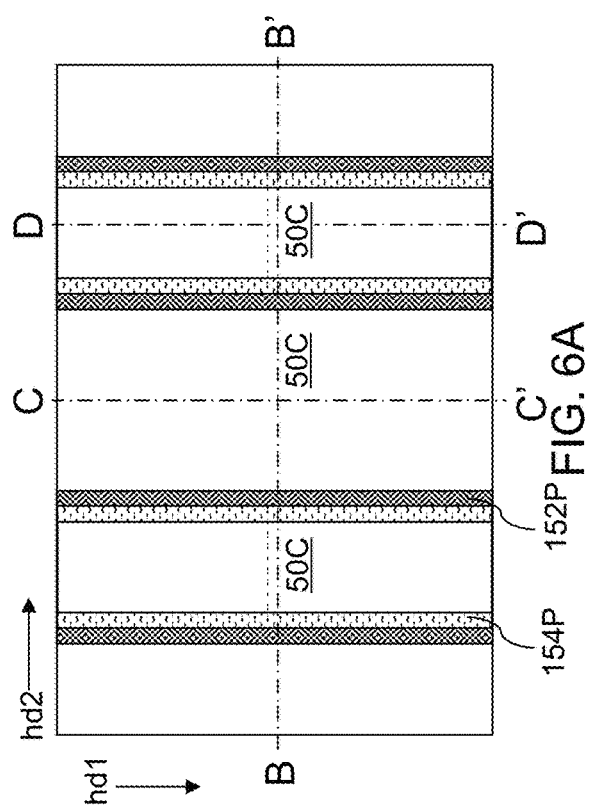
Figure 6B:
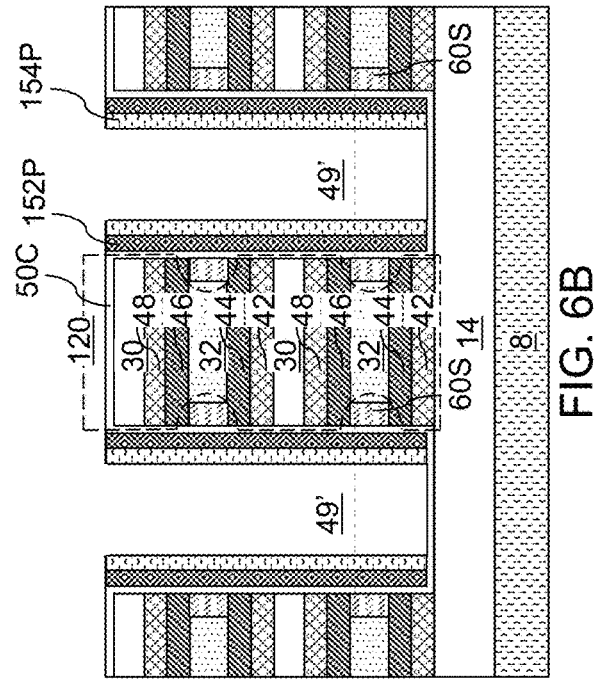
Figure 8C:
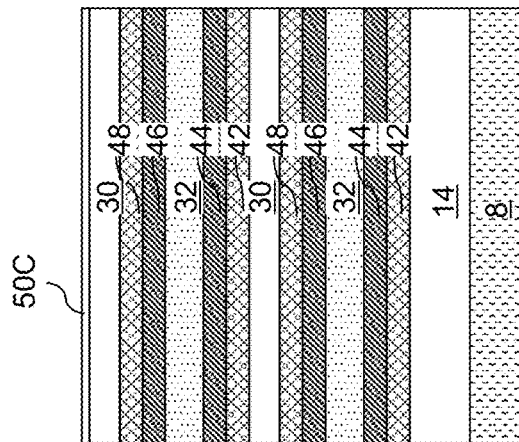
FIGS. 8A, 8B, 8C, and 8D are various views of the exemplary structure after recessing of first metallic liner plates and first ferroelectric dielectric plates according to an embodiment of the present disclosure.
Figure 8D:
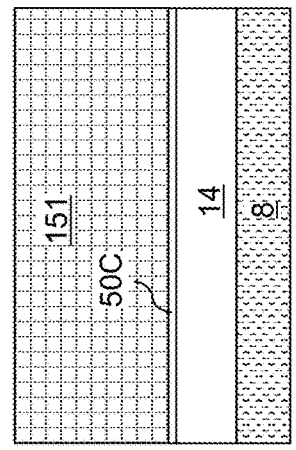
Figure 8A:
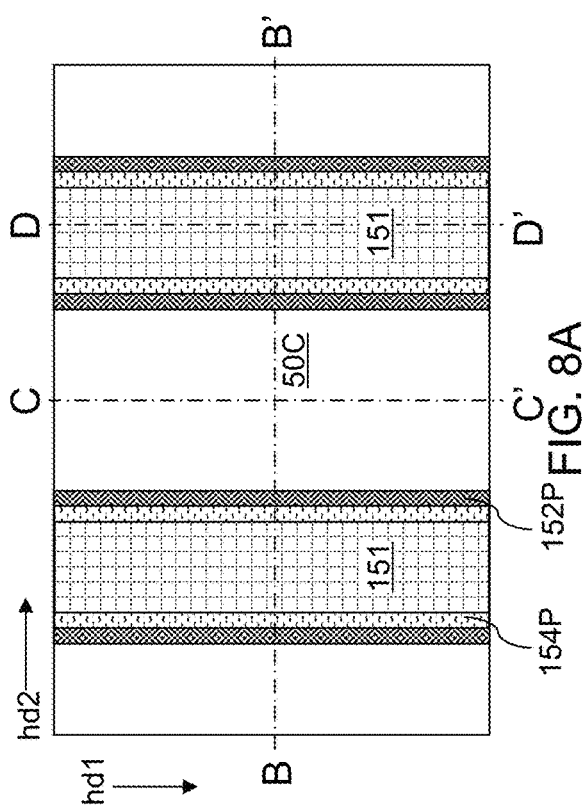
Figure 8B:
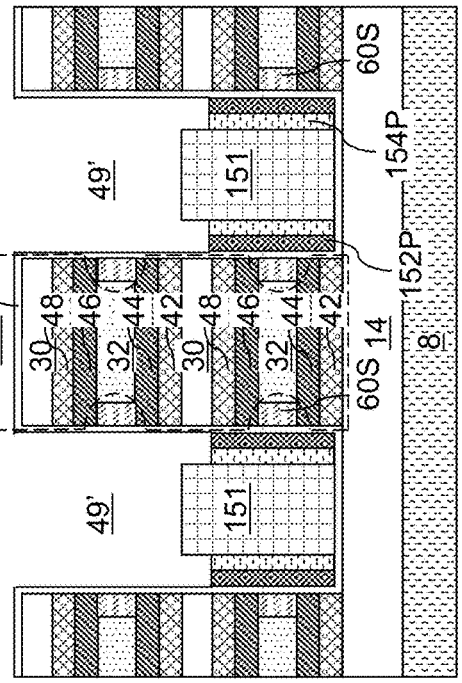
Figure 10C:
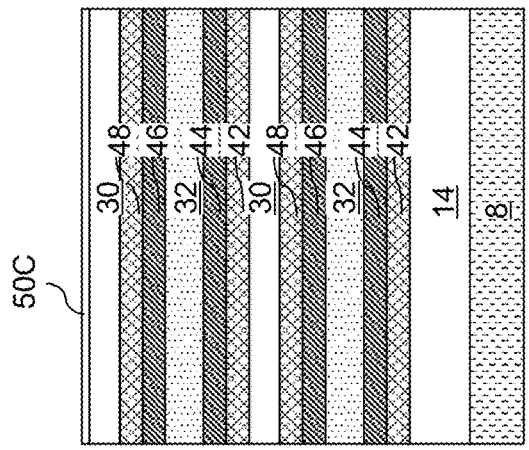
FIGS. 10A, 10B, 10C, and 10D are various views of the exemplary structure after formation of second metallic liner plates and second ferroelectric dielectric plates according to an embodiment of the present disclosure.
Figure 10D:
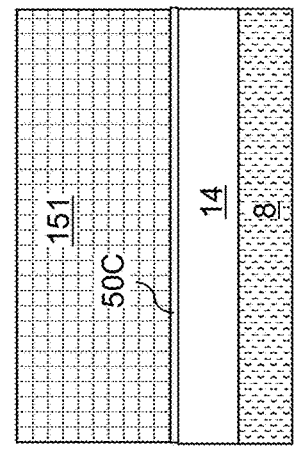
Figure 10A:
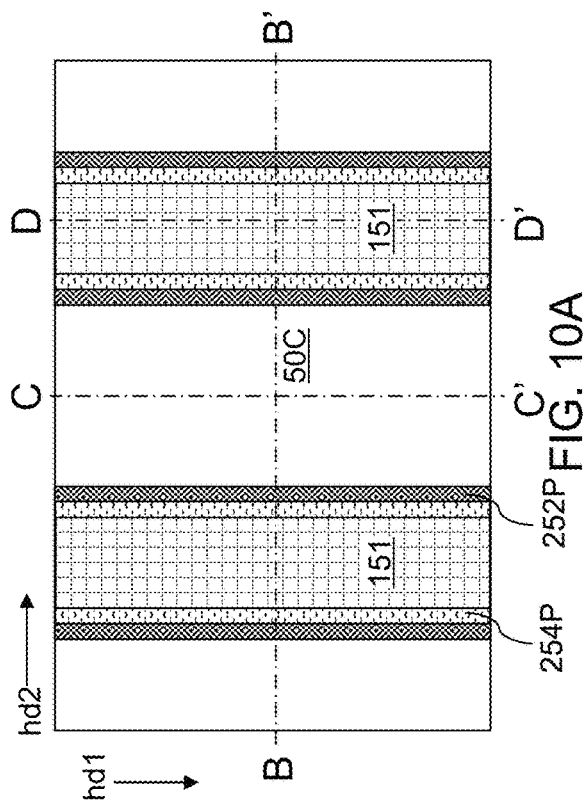
Figure 10B:
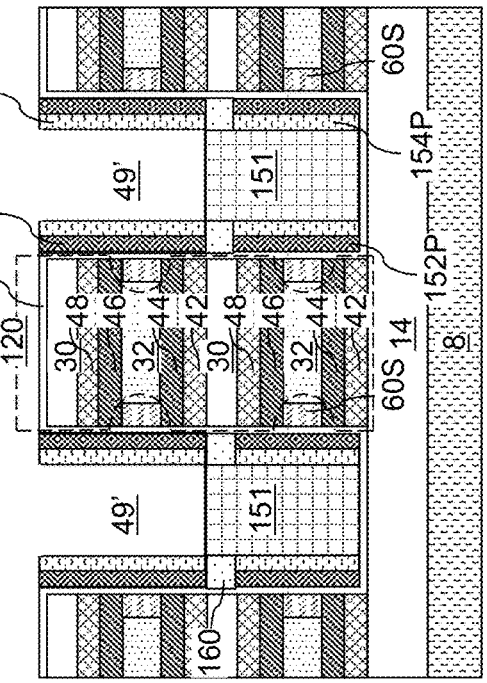
Figure 11C:
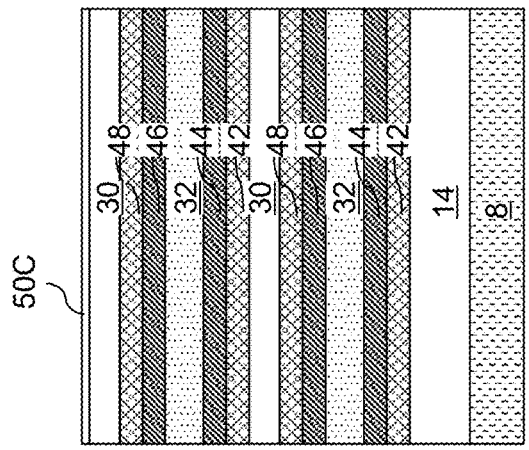
FIGS. 11A, 11B, 11C, and 11D are various views of the exemplary structure after removal of sacrificial fill structures according to an embodiment of the present disclosure.
Figure 11D:
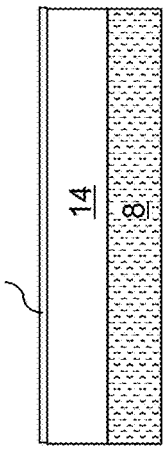
Figure 11A:
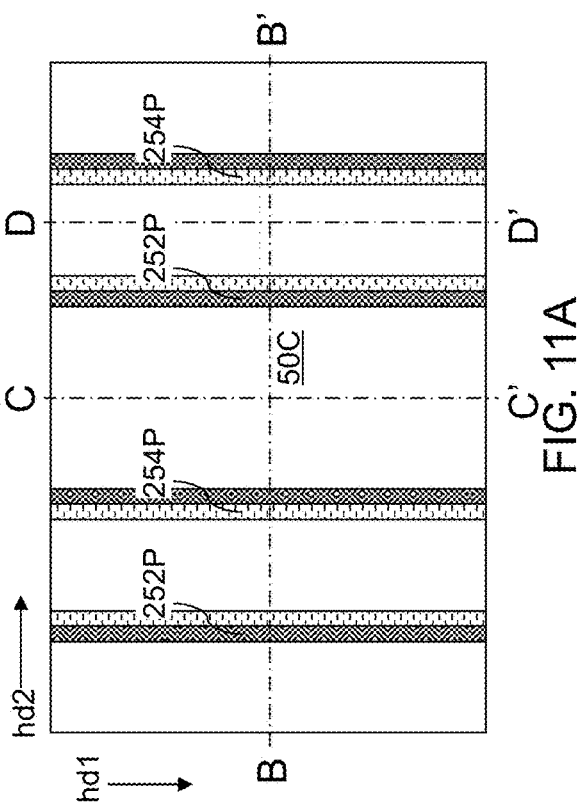
Figure 11B:
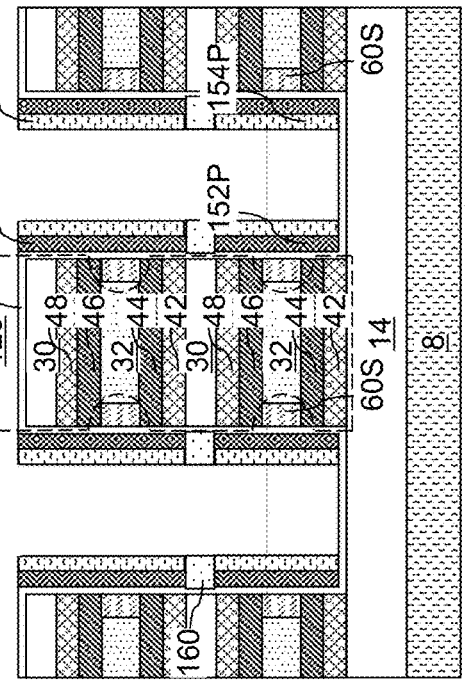

As discussed above, embodiments of the present disclosure are directed to a cross-point array of ferroelectric field effect transistors and methods of manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Referring to FIGS. 1A, 1B, and 1C, an exemplary structure according to an embodiment of the present disclosure is illustrated. The exemplary structure comprises a substrate 8, which can be a semiconductor substrate such as a commercially available wafer. Optionally, semiconductor devices (not shown) such as complementary metal-oxide-semiconductor (CMOS) transistors can be formed on the top surface of the substrate 8. The CMOS transistors can include a control (i.e., driver) circuit for controlling a memory array to be subsequently formed thereabove.

A planar dielectric isolation layer 14 including a dielectric material such as silicon oxide can be formed above the substrate 8. In case semiconductor devices are formed on the top surface of the substrate 8, the planar dielectric isolation layer 14 can be formed above such semiconductor devices (such as field effect transistors). In one embodiment, the planar dielectric isolation layer 14 may be planarized to provide a horizontal top surface. The thickness of the planar dielectric isolation layer 14 may be in a range from 50 nm to 500 nm, although lesser and greater thicknesses can also be employed.

At least one instance of a unit layer sequence can be formed over the planar dielectric isolation layer 14. Each instance of the unit layer sequence can include a metallic source layer 42L, a doped semiconductor source layer 44L, a channel-level insulating layer 32L, a doped semiconductor drain layer 46L, a metallic drain layer 48L, and an inter-transistor-level insulating layer 30L (which is also referred to as a second insulating layer) over the planar dielectric isolation layer 14. The metallic source layer 42L can contact a surface of the doped semiconductor source layer 44L, and can be vertically spaced from the channel-level insulating layer 32L within each unit layer sequence by the doped semiconductor source layer 44L. The metallic drain layer 48L can contact the doped semiconductor drain layer 46L, and can be vertically spaced from the channel-level insulating layer 32L by the doped semiconductor drain layer 46L.

As used herein, a "unit layer sequence" refers to a layer stack of multiple layers that functions as a unit of repetition within a structure in which multiple instances of the layer stack is repeated. A topmost insulating layer may be formed in lieu of the inter-transistor-level insulating layer 30L in the topmost instance of the unit layer sequence (42L, 44L, 32L, 46L, 48L, 30L). In one embodiment, a plurality (e.g., two) of the instances of the unit layer sequence (42L, 44L, 32L, 46L, 48L, 30L) may be formed over the planar dielectric isolation layer 14, as shown in FIGS. 1B and 1C. Alternatively, a single instance of the unit layer sequence (42L, 44L, 32L, 46L, 48L, 30L) may be formed over the planar dielectric isolation layer 14, as will be described below with respect to FIGS. 19A-19E. The total number of repetitions of the unit layer sequence (42L, 44L, 32L, 46L, 48L, 30L) can be the same as the total number of levels of vertical field effect transistors to be subsequently formed, which can be the same as the total number of levels of memory elements to be subsequently formed. As used herein, a "level" refers to a volume of a device located between a horizontal plane including a top surface of an element of the device and a horizontal plane including a bottom surface of the element of the device.

Therefore, a channel-level insulating layer 32L is an insulating layer that is formed between a horizontal plane including a top surface of a semiconductor channel to be subsequently formed and a horizontal plane including a bottom surface of the semiconductor channel to be subsequently formed. An inter-transistor-level insulating layer 30L is an insulating layer that is formed between a horizontal plane including a top surface of an inter-transistor gap to be subsequently formed and a horizontal plane including a bottom surface of the inter-transistor gap is to be subsequently formed if at least two of instances of the unit layer sequence (42L, 44L, 32L, 46L, 48L, 30L) are formed. In case a plurality of instances of the unit layer sequence (42L, 44L, 32L, 46L, 48L, 30L) is formed, the number of repetitions of the unit layer sequence in the multiple instances of the unit layer sequence may be in a range from 2 to 1,024, such as from 8 to 128, although lesser and greater numbers of repetitions can also be employed.

While FIGS. 1B and 1C illustrate an embodiment in which the unit layer sequence includes a layer stack in which the metallic source layer 42L, the doped semiconductor source layer 44L, the channel-level insulating layer 32L, the doped semiconductor drain layer 46L, the metallic drain layer 48L, and the inter-transistor-level insulating layer 30L are arranged from bottom to top, an alternative embodiment is expressly contemplated herein in which the layer stack is arranged from top to bottom in reverse order from that shown in FIGS. 1B and 1C. Generally, the positions of source elements (42L, 44L) can be exchanged with the positions of the drain elements (46L, 48L) because source regions and drain regions may be symmetric in field effect transistors.

The inter-transistor-level insulating layers 30L and the channel-level insulating layers 32L are herein collectively referred to as insulating layers. Each of the insulating layers (30L, 32L) includes a respective insulating material such as a doped silicate glass, undoped silicate glass (e.g., silicon oxide), a metal oxide (e.g., aluminum oxide) or organosilicate glass. The thickness of each channel-level insulating layer 32L can be in a range from 20 nm to 80 nm, and the thickness of each inter-transistor-level insulating layers 30L can be in a range from 10 nm to 60 nm, although lesser and greater thicknesses can also be employed.

According to an embodiment of the present disclosure, the channel-level insulating layers 32L include a first insulating material and the inter-transistor-level insulating layers 30L include a different second insulating material that can provide a lower etch rate in an isotropic etch process than the first insulating material. For example, the channel-level insulating layers 32L can include borosilicate glass or porous or non-porous organosilicate glass, and the inter-transistor-level insulating layers 30L can include undoped silicate glass (i.e., silicon oxide). In this case, the etch rate of the material of the channel-level insulating layers 32L in 100:1 diluted hydrofluoric acid can be at least 10 times, such as 100 or more times, greater than the etch rate of the material of the inter-transistor-level insulating layers 30L in 100:1 diluted hydrofluoric acid. In another embodiment, the inter-transistor-level insulating layers 30L can comprise a semiconductor oxide material (such as undoped silicate glass formed by decomposition of tetraethylorthosilicate) and the channel-level insulating layers 32L can comprise a metal oxide (such as aluminum oxide) which has a higher etch rate in an aluminum oxide selective etchant than silicon oxide.

The doped semiconductor source layers 44L and the doped semiconductor drain layers 46L include a doped semiconductor material such as doped polysilicon or doped amorphous silicon that can be subsequently annealed to form doped polysilicon. The conductivity type of the doped semiconductor source layers 44L and the doped semiconductor drain layers 46L is herein referred to as a first conductivity type, which can be p-type or n-type.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

The atomic concentration of dopants of the first conductivity type in the doped semiconductor source layers 44L and the doped semiconductor drain layers 46L can be in a range from $5.0 \times 10^{18}$/cm³ to $2.0 \times 10^{21}$/cm³, although lesser and greater atomic concentrations can also be employed. The thickness of each doped semiconductor source layer 44L can be in a range from 5 nm to 50 nm, such as from 10 nm to 30 nm, and the thickness of each and the thickness of each doped semiconductor drain layer 46L can be in a range from 5 nm to 50 nm, such as from 10 nm to 30 nm, although lesser and greater thicknesses can also be employed.

The metallic source layers 42L and the metallic drain layers 48L include a metallic material such as an elemental metal, an intermetallic alloy, a conductive metallic nitride material, a conductive metallic carbide material, or a metal-semiconductor alloy (e.g., silicide). For example, the metallic source layers 42L and the metallic drain layers 48L can include tungsten, tantalum, titanium, ruthenium, molybdenum, an intermetallic alloy thereof, titanium nitride, tantalum nitride, tungsten nitride, titanium carbide, tantalum carbide, tungsten carbide, tungsten silicide, titanium silicide, an alloy of at least two of the preceding materials, and/or a layer stack of at least two of the preceding materials. In one embodiment, the metallic source layers 42L and the metallic drain layers 48L can include and/or can consist essentially of tungsten. The thickness of each metallic source layer 42L can be in a range from 10 nm to 50 nm, such as from 20 nm to 30 nm, and the thickness of each and the thickness of each metallic drain layer 48L can be in a range from 10 nm to 50 nm, such as from 20 nm to 30 nm, although lesser and greater thicknesses can also be employed.

The multiple instances of the unit layer sequence (42L, 44L, 32L, 46L, 48L, 30L) can include a first alternating stack of doped semiconductor source layers 44L and doped semiconductor drain layers 46L that are interlaced with a second alternating stack of a channel-level insulating layer 32L and an inter-transistor-level insulating layer 30L. Insulating layers (32L, 30L) are formed between each vertically neighboring pair of a respective doped semiconductor source layer 44L and a respective doped semiconductor drain layer 46L. The channel-level insulating layers 32L are formed between a respective vertically neighboring pair of a doped semiconductor source layer 44L and a doped semiconductor drain layer 46L. In one embodiment, each of the metallic source layers 42L is formed underneath a respective one of the doped semiconductor source layers 44L, and each of metallic drain layers 48L is formed over a respective one of the doped semiconductor drain layers 46L.

Referring to FIGS. 2A-2D, a photoresist layer (not shown) can be applied over the topmost one of the unit layer sequence (42L, 44L, 32L, 46L, 48L, 30L), and can be lithographically patterned to form line-shaped openings that laterally extend along a first horizontal direction hd1 and are laterally spaced apart along a second horizontal direction hd2 that is perpendicular to the first horizontal direction hd1. The width of each line-shaped opening can be uniform. In one embodiment, the pattern of the line-shaped openings can be periodic along the second horizontal direction. The width of each line-shaped opening can be the same, and may be in a range from 60 nm to 300 nm, although lesser and greater widths can also be employed. The spacing between each neighboring pair of line-shaped openings can be in a range from 60 nm to 300 nm, although lesser and greater spacings can also be employed.

An anisotropic etch process can be performed to transfer the pattern in the photoresist layer through the least one instance of the unit layer sequence (42L, 44L, 32L, 46L, 48L, 30L). Line trenches 49 can be formed through each instance of the unit layer sequence (42L, 44L, 32L, 46L, 48L, 30L). The line trenches 49 laterally extend along the first horizontal direction hd1, and divide the least one instance of the unit layer sequence (42L, 44L, 32L, 46L, 48L, 30L) into layer stack structures 120. The layer stack structures 120 laterally extend along the first horizontal direction, and are spaced apart among one another along the second horizontal direction hd2 by the line trenches 49.

Each patterned portion of a metallic source layer 42L comprises a metallic source strip 42. Each patterned portion of a doped semiconductor source layer 44L comprises a doped semiconductor source strip 44. Each patterned portion of a channel-level insulating layer 32L comprises a channel-level insulating strip 32. Each patterned portion of a doped semiconductor drain layer 46L comprises a doped semiconductor drain strip 46. Each patterned portion of a metallic drain layer 48L comprises a metallic drain strip 48. Each patterned portion of an inter-transistor-level insulating layer 30L comprises an inter-transistor-level insulating strip 30.

Each of the layer stack structures 120 comprises at least one instance of a unit layer sequence (42, 44, 32, 36, 38, 30). Each unit layer sequence (42, 44, 32, 36, 38, 30) includes, from bottom to top or top to bottom, a metallic source strip 42, a doped semiconductor source strip 44, a channel-level insulating strip 32, a doped semiconductor drain strip 46, a metallic drain strip 48, and an inter-transistor-level insulating strip 30. Each metallic source strip 42 contacts a doped semiconductor source strip 44. Each metallic drain strip 48 contacts a doped semiconductor drain strip 46. In one embodiment, each of the layer stack structures 120 can comprise multiple instances of the unit layer sequence (42, 44, 32, 36, 38, 30) that are vertically stacked.

Referring to FIGS. 3A-3D, laterally-extending grooves (i.e., recesses) 349 can be formed at each level of the channel-level insulating layers 32L by laterally recessing the channel-level insulating layers 32L relative to the inter-transistor-level insulating layers 30L, the doped semiconductor source layers 44L, the doped semiconductor drain layers 46L, the metallic source layers 42L, and the metallic drain layers 48L. The line trenches 49 are laterally expanded at each level of the channel-level insulating layers 32L by the volumes of the laterally-extending grooves 349. As discussed above, the first insulating material of the channel-level insulating layers 32L provides a greater etch rate than the second insulating material of the inter-transistor-level insulating layers 30L in an isotropic etch process. The isotropic etch process can be a wet etch process employing 100:1 dilute hydrofluoric acid if the channel-level insulating layers 32L comprises a doped silicate glass or an aluminum oxide selective etch medium if the channel-level insulating layers 32L comprise aluminum oxide.

A vertical stack of laterally-extending grooves 349 can be formed around each of the line trenches 49. The height of each laterally-extending groove 349 can be the same as the height of the channel-level insulating layer 32L that is formed at the same level as the respective laterally-extending groove 349. The lateral recess distance for each of the laterally-extending grooves 349 can be in a range from 3 nm to 60 nm, such as from 6 nm to 30 nm, although lesser and greater lateral recess distances can also be employed. Each of the channel-level insulating strips 32 can contact a respective one of the doped semiconductor source strips 44 and a respective one of the doped semiconductor drain strips 46, and can have a width along the second horizontal direction hd2 that is less than the width of the respective one of the doped semiconductor source strips 44 along the second horizontal direction hd2, and less than the width of the respective one of the doped semiconductor drain strips 46 along the second horizontal direction hd2.

Referring to FIGS. 4A-4D, a semiconductor channel material layer can be deposited by a conformal deposition process such as a chemical vapor deposition process. The continuous semiconductor channel layer includes a semiconductor material having a doping of a second conductivity type, which is the opposite of the first conductivity type. For example, if the first conductivity type is n-type, the second conductivity type is p-type, and vice versa. The semiconductor material in the continuous semiconductor channel layer can include silicon (e.g., polysilicon or amorphous silicon), a silicon-germanium alloy, or a compound semiconductor material. The atomic concentration of dopants of the second conductivity type in the continuous semiconductor channel layer can be in a range from $1.0 \times 10^{14}/cm^3$ to $3.0 \times 10^{17}/cm^3$, although lesser and greater atomic concentrations can also be employed. The thickness of the continuous semiconductor channel layer is greater than the lateral recess distance of the laterally-extending grooves 349. For example, the thickness of the continuous semiconductor channel layer can be in a range from 6 nm to 120 nm, such as from 12 nm to 60 nm, although lesser and greater thicknesses can also be employed.

Subsequently, portions of the semiconductor channel material layer located outside the laterally-extending grooves 349 can be removed by performing an anisotropic etch process such as a reactive ion etch process. Each remaining portion of the semiconductor channel material layer comprises a semiconductor channel material strip 60S. Generally, the semiconductor channel material strips 60S can be formed by filling the laterally-extending grooves 349 with a semiconductor material having a doping of the second conductivity type, and by removing excess portions of the semiconductor material from outside volumes of the laterally-extending grooves 349. Remaining portions of the semiconductor material in the laterally-extending grooves comprise the semiconductor channel material strips 60S.

In case each layer stack structure 120 comprises multiple instances of the unit layer sequence (42, 44, 32, 36, 38, 30), a vertical stack of semiconductor channel material strips 60S can be formed on each sidewall of a layer stack structure 120. Each vertical stack of semiconductor channel material strips 60S is formed as a set of semiconductor channel material strip 60S located in a respective laterally-extending groove 349 and vertically spaced apart from each other, i.e., without direct contact with each other. Each semiconductor channel material strip 60S can have a rectangular horizontal cross-sectional shape along vertical planes that are perpendicular to the first horizontal direction hd1.

Each of the semiconductor channel material strips 60S contacts a sidewall of a respective one of the channel-level insulating layers 32L. The insulating layers (32L, 30L) in the multiple instances of the unit layer sequence include channel-level insulating layers 32L in contact with a sidewall of a respective one of the semiconductor channel material strips 60S, and inter-transistor-level insulating layers 30L that do not contact any of the semiconductor channel material strips 60S. Sidewalls of the channel-level insulating layers 32L are laterally recessed outward relative to sidewalls of the inter-transistor-level insulating layers 30L and relative to sidewalls of the doped semiconductor source layers 44L and the doped semiconductor drain layers 46L around each line trench 49. Each of the channel-level insulating layers 32L can be in direct contact with horizontal surfaces of a respective one of the doped semiconductor source layers 44L and a respective one of the doped semiconductor drain layers 46L.

Each of the semiconductor channel material strips 60S is formed on horizontal surfaces of a respective vertically neighboring pair of a doped semiconductor source layer 44L and a doped semiconductor drain layer 46L prior to formation of the memory films and the local word lines (i.e., gate electrodes), such as vertical word lines. A vertical stack of vertical semiconductor channels 60 is formed in each of the line trenches 49. Each of the vertical semiconductor channels 60 is connected to a respective vertically neighboring pair of a doped semiconductor source layer 44L and a doped semiconductor drain layer 46L.

In one embodiment, an entirety of a sidewall of each semiconductor channel material strip 60S contacts a straight vertical sidewall of a respective channel-level insulating layer 32L located between a respective vertically neighboring pair of a doped semiconductor source layer 44L and a doped semiconductor drain layer 46L. Each semiconductor channel material strip 60S can contact horizontal surfaces of a respective vertically neighboring pair of a doped semiconductor source layer 44L and a doped semiconductor drain layer 46L. As discussed above, the doped semiconductor source layer 44L may underlie or overlie the doped semiconductor drain layer 46L within each unit layer sequence (42L, 44L, 32L, 46L, 48L, 30L) of the continuous material layers as formed at the processing steps of FIGS. 1A-1C. Thus, the doped semiconductor source strip 44 may underlie or overlie the doped semiconductor drain strip 46 within each unit layer sequence (42, 44, 32, 46, 48, 30).

The physically exposed sidewalls of the semiconductor channel material strip 60S can be vertically coincident with sidewalls of other layers within a same layer stack structure 120. Thus, each of the semiconductor channel material strip 60S can comprise a respective sidewall that is vertically coincident with sidewalls of at least one doped semiconductor source strip 44 and with at least one doped semiconductor drain strip 46 within a same layer stack structure 120.

Referring to FIGS. 5A-5D, a continuous gate dielectric layer 50C can be deposited on the physically exposed surfaces of the layer stack structures 120 and the semiconductor channel material strip 60S. The continuous gate dielectric layer 50C can include any gate dielectric material known in the art. For example, the continuous gate dielectric layer 50C can include silicon oxide and/or a dielectric metal oxide material (such as aluminum oxide). The continuous gate dielectric layer 50C can be formed by a conformal deposition method such as a chemical vapor deposition (CVD) process, and can have a thickness in a range from 1 nm to 12 nm, such as from 2 nm to 6 nm. Each vertically-extending portion of the continuous gate dielectric layer 50C includes a pair of straight sidewalls that vertically extend through multiple levels of the layer stack structures 120 and located within a respective planar vertical plane that is perpendicular to the second horizontal direction hd2.

Referring to FIGS. 6A-6D, a first continuous metallic liner layer can be conformally deposited and anisotropically etched. For example, the first continuous metallic liner layer can be deposited by a conformal deposition process such as a chemical vapor deposition (CVD) process. An anisotropic etch process, such as a reactive ion etch process, can be performed to remove horizontal portions of the first continuous metallic liner layer. Remaining portion of the first continuous metallic liner in each line trench 49 includes a pair of first metallic liner plates 152P. The first metallic liner plates 152P include a metallic (i.e., electrically conductive) material such as a metallic nitride material, an elemental metal, or an intermetallic alloy. For example, the first metallic liner plates 152P can include a material such as TiN, TaN, WN, Ti, Ta, W, or an alloy or a stack thereof. In one embodiment, the first metallic liner plates 152P include TiN. The lateral thickness of the first metallic liner plates 152P can be in a range from 2 nm to 30 nm, such as from 4 nm to 15 nm, although lesser and greater thicknesses can also be employed.

A first continuous ferroelectric dielectric layer including a ferroelectric dielectric material can be conformally deposited. For example, the first continuous ferroelectric dielectric layer can be deposited by a conformal deposition process such as a chemical vapor deposition process or an atomic layer deposition process. An anisotropic etch process can be performed to remove horizontal portions of the first continuous ferroelectric dielectric layer. Remaining portion of the continuous ferroelectric dielectric layer in each line trench 49 includes a pair of first ferroelectric dielectric plates 154P. The first ferroelectric dielectric plates 154P include, and/or consist essentially of, at least one ferroelectric dielectric material such as hafnium oxide (such as hafnium oxide containing at least one dopant selected from Al, Zr, and Si and having a ferroelectric non-centrosymmetric orthorhombic phase), zirconium oxide, hafnium-zirconium oxide, bismuth ferrite, barium titanate (such as $BaTiO_3$; BT), colemanite (such as $Ca_2B_6O_{11} \cdot 5H_2O$), bismuth titanate (such as $Bi_4Ti_3O_{12}$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x}O_3)$), lead titanate (such as $PbTiO_3$; PT), lead zirconate titanate (such as $Pb(Zr,Ti) O_3$; PZT), lithium niobate (such as $LiNbO_3$; LN), ($LaAlO_3$)), polyvinylidene fluoride ($CH_2CF_2)_n$, potassium niobate (such as $KNbO_3$), potassium sodium tartrate (such as $KNaC_4H_4O_6 \cdot 4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$ (LT)), lead lanthanum titanate (such as $(Pb,La)TiO_3$ (PLT)), lead lanthanum zirconate titanate (such as $(Pb,La)(Zr,Ti)O_3$ (PLZT)), ammonium dihydrogen phosphate (such as $NH_4H_2PO_4$ (ADP)), or potassium dihydrogen phosphate (such as $KH_2PO_4$ (KDP)). In one embodiment, the ferroelectric dielectric material can include and/or can consist essentially of the hafnium oxide. The thickness of the first ferroelectric dielectric plates 154P can be in a range from 2 nm to 30 nm, such as from 4 nm to 15 nm, although lesser and greater thicknesses can also be employed. A line cavity 49' is present within each line trench 49.

Referring to FIGS. 7A-7D, a sacrificial fill material such as amorphous silicon, a polymer material, amorphous carbon, or organosilicate glass can be deposited in bottom portions of the line cavities 49'. The sacrificial fill material can be vertically recessed to the level of a horizontal plane including top surfaces of a set of inter-transistor-level insulating strips 30. Remaining portions of the sacrificial fill material constitute sacrificial fill structures 151.

Referring to FIGS. 8A-8D, a first isotropic etch process that etches the material of the first ferroelectric dielectric plates 154P can be performed to remove portions of the first ferroelectric dielectric plates 154P that overlie the top surfaces of the sacrificial fill structures 151. Remaining portion of each first ferroelectric dielectric plate 154P can have a top surface that is recessed below the horizontal plane including the top surfaces of the sacrificial fill structures 151.

A second isotropic etch process that etches the material of the first metallic liner plates 152P can be performed to remove portions of the first metallic liner plates 152P that overlies the top surfaces of the sacrificial fill structures 151. Remaining portions of each first metallic liner plate 152P can have a top surface that is recessed below the horizontal plane including the top surfaces of the sacrificial fill structures 151. Recess cavities are formed above each combination of a first metallic liner layer 152P and a first ferroelectric dielectric plate 154P between a neighboring pair of a sacrificial fill structure 151 and a layer stack structure 120.

Referring to FIGS. 9A-9D, a dielectric material can be deposited in the recess cavities by a conformal deposition process. For example, a doped silicate glass material can be deposited to a thickness that fills the recess cavities. An isotropic etch process can be performed to etch portions of the dielectric material located outside the recess cavities. Remaining portions of the deposited dielectric material comprise vertical dielectric spacers 160.

Referring to FIGS. 10A-10D, a second continuous metallic liner layer can be conformally deposited and anisotropically etched. For example, the second continuous metallic liner layer can be deposited by a conformal deposition process such as a chemical vapor deposition (CVD) process. An anisotropic etch process, such as a reactive ion etch process, can be performed to remove horizontal portions of the second continuous metallic liner layer. Remaining portion of the second continuous metallic liner in each line trench 49 includes a pair of second metallic liner plates 252P. The second metallic liner plates 252P include a metallic (i.e., electrically conductive) material such as a metallic nitride material, an elemental metal, or an intermetallic alloy. For example, the second metallic liner plates 252P can include a material such as TiN, TaN, WN, Ti, Ta, W, or an alloy or a stack thereof. In one embodiment, the second metallic liner plates 252P include TiN. The lateral thickness of the second metallic liner plates 252P can be in a range from 2 nm to 30 nm, such as from 4 nm to 15 nm, although lesser and greater thicknesses can also be employed.

A second continuous ferroelectric dielectric layer including a ferroelectric dielectric material can be conformally deposited. For example, the second continuous ferroelectric dielectric layer can be deposited by a conformal deposition process such as a chemical vapor deposition process or an atomic layer deposition process. An anisotropic etch process can be performed to remove horizontal portions of the second continuous ferroelectric dielectric layer. Remaining portion of the continuous ferroelectric dielectric layer in each line trench 49 includes a pair of second ferroelectric dielectric plates 254P. The second ferroelectric dielectric plates 254P include, and/or consist essentially of, at least one ferroelectric dielectric material. The second ferroelectric dielectric plates 254P can include any ferroelectric dielectric material that can be employed for the first ferroelectric dielectric plates 154P. In one embodiment, the ferroelectric dielectric material can include and/or can consist essentially of the hafnium oxide. The thickness of the second ferroelectric dielectric plates 254P can be in a range from 2 nm to 30 nm, such as from 4 nm to 15 nm, although lesser and greater thicknesses can also be employed. A line cavity 49' is present within each line trench 49.

Referring to FIGS. 11A-11D, the sacrificial fill structures 151 can be removed selective to the first ferroelectric dielectric plates 154P, the second ferroelectric dielectric plates 254P, and the vertical dielectric spacers 160 by performing an isotropic etch process. For example, if the sacrificial fill structures 151 include amorphous silicon, a wet etch process employing hot trimethyl-2 hydroxyethyl ammonium hydroxide ("hot TMY") or tetramethyl ammonium hydroxide (TMAH) may be performed.

Referring to FIGS. 12A-12D, a sacrificial fill material can be deposited in each unfilled volume of the line trenches 79. The sacrificial fill material includes a material that can be removed selective to the material of the ferroelectric dielectric plates (154P, 254P). For example, the sacrificial fill material can include a semiconductor material such as amorphous silicon or polysilicon, or a dielectric material that can be etched selective to silicon oxide (such as organosilicate glass), a carbon-based material (such as amorphous carbon or diamond-like carbon), or a polymer material. The sacrificial fill material can be deposited by a conformal deposition process or a non-conformal deposition process. Excess portions of the sacrificial fill material can be removed from above the horizontal plane including the top surface of the topmost layers of the layer stack structures 120, for example, by a chemical mechanical planarization (CMP) process. Each remaining portion of the sacrificial fill material located within a respective one of the line trenches 49 comprises a sacrificial fill material rail 57R. Each sacrificial fill material rail 57R can laterally extend along the first horizontal direction hd1, and can have a vertical cross-sectional shape within vertical planes that are perpendicular to the first horizontal cross-sectional shape hd1 that is invariant under translation along the first horizontal direction hd1. Portions of the continuous gate dielectric layer 50C that overlie the top surface of the topmost layers of the layer stack structures 120 can be removed during the planarization process. Each remaining portion of the continuous gate dielectric layer 50C comprises a gate dielectric layer 50L. Each gate dielectric layer 50L can include a pair of first vertically-extending portions that laterally extend along the first horizontal direction hd1 and a horizontally-extending portion adjoined to bottom edges of the pair of first vertically-extending portions. In one embodiment, the gate dielectric layer 50L can include a pair of second vertically-extending portions (not shown) that laterally extend along the second horizontal direction hd2 and adjoined to side edges of the pair of first vertically-extending portions of the gate dielectric layer 50L.

The set of all material portions that fills a line trench 49 comprises an in-process line trench fill structure (60S, 50L, 152P, 252P, 154P, 254P, 57R). Each in-process line trench fill structure (60S, 50L, 152P, 252P, 154P, 254P, 57R) comprises at least one pair of semiconductor channel material strips 60S, a gate dielectric layer 50L, a pair of metallic liner plates (152P, 252P), a pair of ferroelectric dielectric plates (154P, 254P), and a sacrificial fill material rail 57R. The gate dielectric layer 50L is formed on the at least one pair of semiconductor channel material strips 60S. The pair of metallic liner plates (152P, 252P) is formed on sidewalls of the gate dielectric layer 50L. The pair of ferroelectric dielectric plates (154P, 254P) is formed over, and directly on, sidewalls of the metallic liner plates (152P, 252P). A laterally alternating sequence of in-process line trench fill structures (60S, 50L, 152P, 252P, 154P, 254P, 57R) and layer stack structures 120 can be formed. The in-process line trench fill structures (60S, 50L, 152P, 252P, 154P, 254P, 57R) and the layer stack structures 120 can alternate along the second horizontal direction hd2.

Referring to FIGS. 13A-13D, a photoresist layer 67 can be formed over the in-process line trench fill structures (60S, 50L, 152P, 252P, 154P, 254P, 57R) and the layer stack structures 120, and can be lithographically patterned with a line and space pattern. Line-shaped openings that laterally extend along the second horizontal direction hd2 can be formed among patterned portions of the photoresist layer 67. Each line-shaped opening can have a uniform width along the first horizontal direction hd1. The uniform width can be invariant under translation along the second horizontal direction hd2. The spacing between each neighboring pair of line-shaped openings can be uniform. The line and space pattern in the photoresist layer 67 can be a periodic pattern that is repeated along the first horizontal direction hd1 with a periodicity. The width of each line-shaped opening can be the same, and may be in a range from 60 nm to 300 nm, although lesser and greater widths can also be employed. The spacing between each neighboring pair of line-shaped openings can be in a range from 60 nm to 300 nm, although lesser and greater spacings can also be employed.

An anisotropic etch process can be performed to etch unmasked portions of the sacrificial fill material rails 57R. The anisotropic etch process etches the material of the sacrificial fill material rails 57R selective to the material of the topmost layers of the layer stack structures 120, i.e., the topmost ones of the inter-transistor-level insulating strips 30 within areas that are not masked by the photoresist layer 67. In one embodiment, the anisotropic etch process may etch the material of the sacrificial fill material rails 57R selective to the materials of the metallic liner plates (152P, 252P) and/or the ferroelectric dielectric plates (154P, 254P) within areas that are not masked by the photoresist layer 67. Alternatively, the anisotropic etch process may etch the materials of the sacrificial fill material rails 57R, the metallic liner plates (152P, 252P), and/or the ferroelectric dielectric plates (154P, 254P) within areas that are not masked by the photoresist layer 67. The patterned portions of the sacrificial fill material rails 57R include sacrificial fill material pillars 57 having a respective rectangular horizontal cross-sectional shape. A pillar cavity 59 is formed in each volume from which a portion of a sacrificial fill material rails 57R is removed during the anisotropic etch process. A sacrificial fill material pillar 57 can be located between each pair of pillar cavities 59 that are located within a same line trench 49 and that are laterally spaced apart along the first horizontal direction hd1. A two-dimensional array of pillar cavities 59 and a two-dimensional array of sacrificial fill material pillars 57 can be formed in the exemplary structure.

Referring to FIGS. 14A-14E, in case the anisotropic etch process that etches unmasked portions of the sacrificial fill material rails 57R does not remove unmasked portions of the ferroelectric dielectric plates (154P, 254P), an isotropic etch process can be performed while the photoresist layer 67 is present to isotropically etch portions of the ferroelectric dielectric plates (154P, 254P) located around each pillar cavity 59. Each ferroelectric dielectric plate (154P, 254P) is divided into multiple discrete portions, each of which is herein referred to as a ferroelectric dielectric layer 54. Each ferroelectric dielectric layer 54 can include a pair of laterally concave and vertically straight sidewalls that are exposed to a pair of pillar cavities 59. As used herein, a surface is laterally concave if the surface has a concave profile in a horizontal cross-sectional view. A surface is vertically straight if the surface has a straight profile in a vertical cross-sectional view.

In case the anisotropic etch process that etches unmasked portions of the sacrificial fill material rails 57R does not remove unmasked portions of the metallic liner plates (152P, 252P), another isotropic etch process can be performed while the photoresist layer 67 is present to isotropically etch portions of the metallic liner plates (152P, 252P) located around each pillar cavity 59. Each metallic liner plates (152P, 252P) is divided into multiple discrete portions, each of which is herein referred to as a metallic liner 52. Each metallic liner 52 can include a pair of laterally concave and vertically straight sidewalls that are exposed to a pair of pillar cavities 59.

Figure 14A:
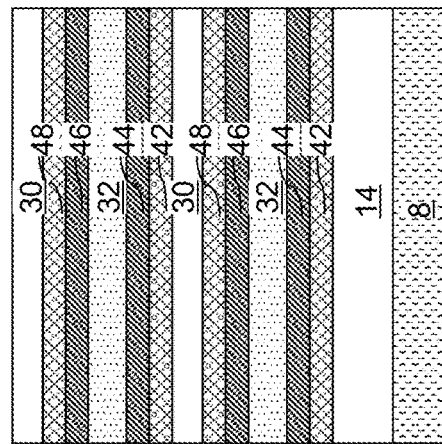
FIGS. 14A, 14B, 14C, 14D, and 14E are various views of the exemplary structure after expansion of the pillar cavities according to an embodiment of the present disclosure.
Figure 14C:
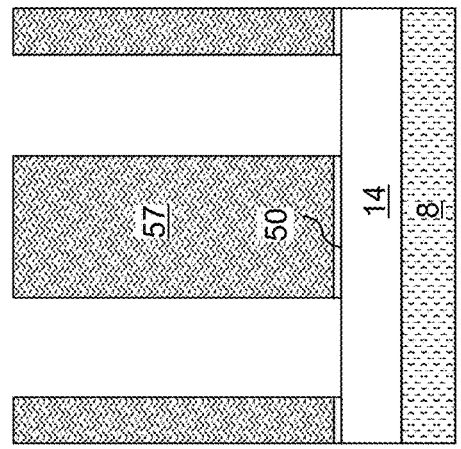
Figure 14B:
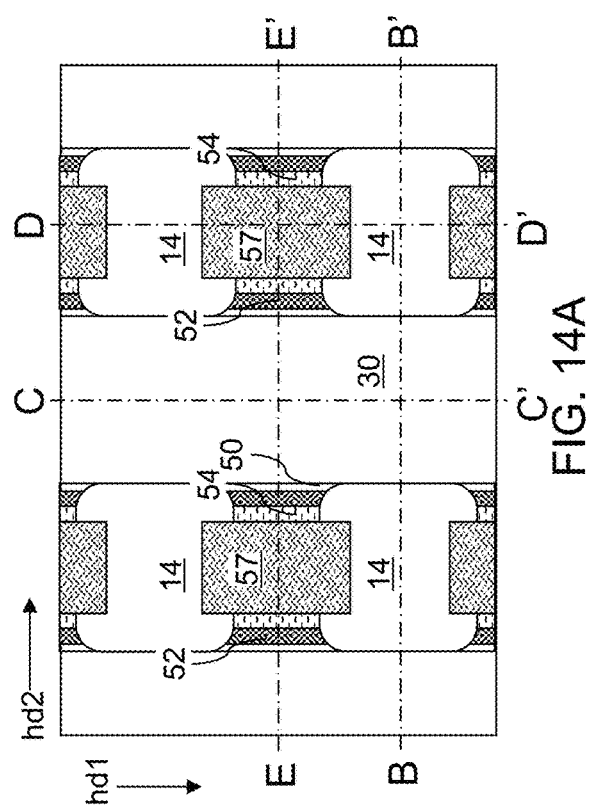
Figure 14D:
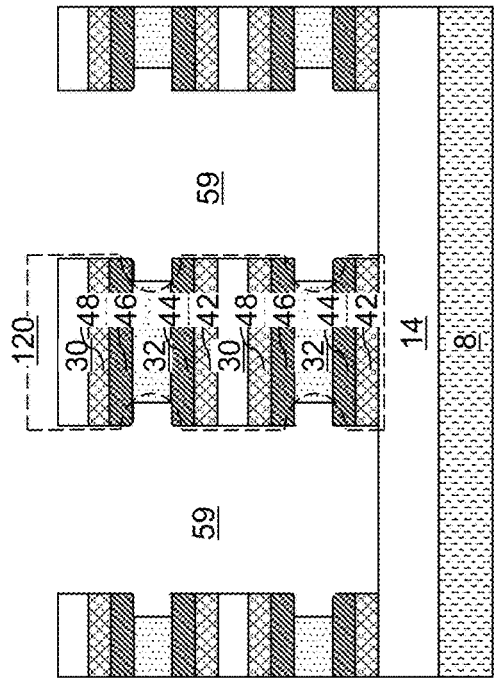
Figure 14E:
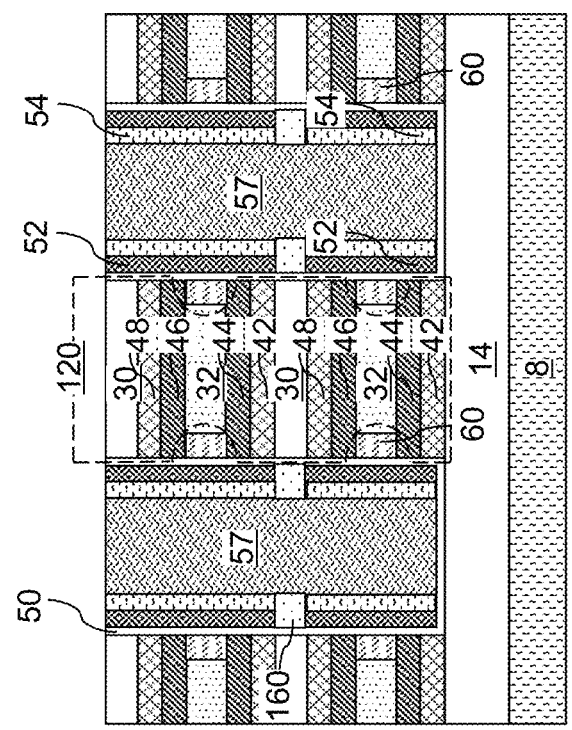

An isotropic etch process can be performed to remove physically exposed portions of the gate dielectric layers 50L. For example, if the gate dielectric layers 50L include silicon oxide, a wet etch process employing dilute hydrofluoric acid can be employed to etch portions of the gate dielectric layers 50L that are located around the pillar cavities 59. Each gate dielectric layer 50L is divided into multiple discrete portions. Each patterned portion of a gate dielectric layer 50L comprises a gate dielectric 50. Each gate dielectric 50 can include a pair of vertically-extending gate dielectric portions and a horizontally-extending gate dielectric portion that is adjoined to the bottom edges of the pair of vertically-extending gate dielectric portions and that contacts a respective sacrificial fill material pillar 57, as shown in FIG. 14E.

Subsequently, an isotropic etch process that etches the material of the semiconductor channel material strips 60S can be performed to etch physically exposed portions of the semiconductor channel material strips 60S. In one embodiment, the isotropic etch process may be selective to the materials of the doped semiconductor source strips 44 and the doped semiconductor drain strips 46. In this case, an etch chemistry that etches lightly-doped semiconductor materials selective to heavily-doped semiconductor materials can be employed. In an illustrative example, a wet etch process using hot trimethyl-2 hydroxyethyl ammonium hydroxide ("hot TMY") or tetramethyl ammonium hydroxide (TMAH) may be used to remove portions of the semiconductor channel material strips 60S from around the pillar cavities 59, as shown in FIG. 14B. Each semiconductor channel material strip 60S can be divided into multiple vertical semiconductor channels 60 that are laterally spaced apart from each other along the first horizontal direction hd1. Each vertical semiconductor channel 60 can contact a respective one of the gate dielectrics 50.

In an alternative embodiment, the isotropic etch process may not be selective to the materials of the doped semiconductor source strips 44 and the doped semiconductor drain strips 46. In this case, the isotropic etch process can non-selectively etch the materials of the semiconductor channel material strips 60S, the doped semiconductor source strips 44, and the doped semiconductor drain strips 46. Despite the collateral etching of the portions of the portions of the doped semiconductor source strips 44 and the doped semiconductor drain strips 46 around each pillar cavity 59, each of the doped semiconductor source strips 44 and the doped semiconductor drain strips 46 can remain as a continuous structure by limiting the lateral etch distance for doped semiconductor source strips 44 and the doped semiconductor drain strips 46 to be less than one half of the width of each of the doped semiconductor source strips 44 and the doped semiconductor drain strips 46 along the second horizontal direction hd2, and to be less than one half of the width of each sacrificial fill material pillar 57 along the first horizontal direction hd1. In this case, each vertical semiconductor channels 60 can directly contact a horizontal surface of a respective one of the doped semiconductor source strips 44, and a horizontal surface of a respective one of the doped semiconductor drain strips 46. Subsequently, the photoresist layer 67 can be removed, for example, by ashing.

Each contiguous combination of a sacrificial fill material pillar 57, a gate dielectric 50, a pair of metallic liners 52, a pair of ferroelectric dielectric layers 54, and at least one pair of vertical semiconductor channels 60 constitutes an in-process memory pillar structure (57, 50, 52, 54, 60). Generally, each in-process line trench fill structure (60S, 50L, 152P, 252P, 154P, 254P, 57R) can be patterned into a row of in-process memory pillar structures (57, 50, 52, 54, 60) by etching pillar cavities 59 through each in-process line trench fill structure (60S, 50L, 152P, 252P, 154P, 254P, 57R). Each pair of ferroelectric dielectric layers 54 in an in-process memory pillar structure (57, 50, 52, 54, 60) comprises patterned portions of a respective pair of ferroelectric dielectric plates (154P, 254P). The at least one pair of vertical semiconductor channels 60 in an in-process memory pillar structure (57, 50, 52, 54, 60) comprises patterned portions of a respective subset of the semiconductor channel material strips 60S.

Each of the vertical semiconductor channels 60 can contact a respective one of the doped semiconductor source strips 44, a respective one of the doped semiconductor drain strips 46, and a respective one of the channel-level insulating strips 32. In one embodiment, each of the channel-level insulating strips 32 can contact two rows of vertical semiconductor channels 60 arranged along the first horizontal direction hd1. Neighboring pairs of vertical semiconductor channels 60 within each row of vertical semiconductor channels 60 can be laterally spaced by a respective one of the pillar cavities 59.

In one embodiment, each of the ferroelectric dielectric layers 54 can have a first straight sidewall that vertically extends through multiple levels of the layer stack structures 120, and can contact a respective one of the sacrificial fill material pillars 57, and a second straight sidewall that is parallel to the first straight sidewall and faces a respective one of the layer stack structures 120. In one embodiment, each of the in-process memory pillar structures (57, 50, 52, 54, 60) comprises a pair of metallic liners 52 contacting the pair of ferroelectric dielectric layers 54. Each of the in-process memory pillar structures (57, 50, 52, 54, 60) comprises a pair of vertically-extending gate dielectric portions that contacts the pair of metallic liners 52. Each of the vertically-extending gate dielectric portions can contact a sidewall of a respective one of the layer stack structures 120, as shown in FIG. 14E. In one embodiment, each of the vertically-extending gate dielectric portions can contact each metallic source strip 42, each doped semiconductor source strip 44, each doped semiconductor drain strip 46, and each metallic drain strip 48 within a respective one of the layer stack structures 120, and does not directly contact any channel-level insulating strip 32 within the respective one of the layer stack structures 120. In one embodiment, each of the ferroelectric dielectric layers 54 comprises a pair of laterally-concave and vertically-straight sidewalls that are physically exposed to a pair of pillar cavities 59, as shown in FIG. 14A.

Referring to FIGS. 15A-15E, a dielectric material such as silicon oxide can be deposited in the pillar cavities 59 by a conformal deposition process (such as a chemical vapor deposition process) or a self-planarizing deposition process (such as spin coating). Excess portions of the dielectric material can be removed from above the horizontal plane including the topmost surfaces of the layer stack structures 120, for example, by a planarization process. The planarization process can include a chemical mechanical planarization (CMP) process. Each remaining portion of the dielectric material that fills the pillar cavities 59 comprises a dielectric pillar structure 62. A two-dimensional array of dielectric pillar structures 62 can be formed in the two-dimensional array of pillar cavities 59. A row of dielectric pillar structures 62 is formed within each line trench 49. A laterally alternating sequence of in-process memory pillar structures (57, 50, 52, 54, 60) and dielectric pillar structures 62 can be formed in each line trench 49.

Figure 15C:
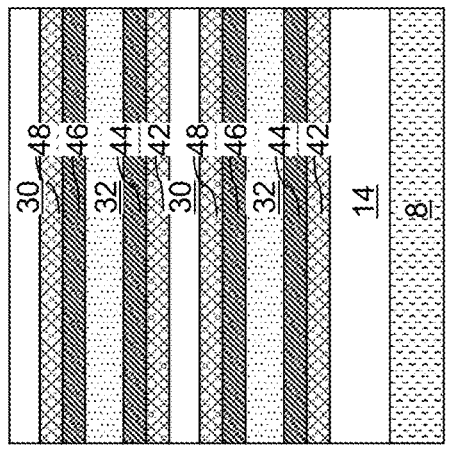
FIGS. 15A, 15B, 15C, 15D, and 15E are various views of the exemplary structure after formation of an array of dielectric pillar structures according to an embodiment of the present disclosure.
Figure 15D:
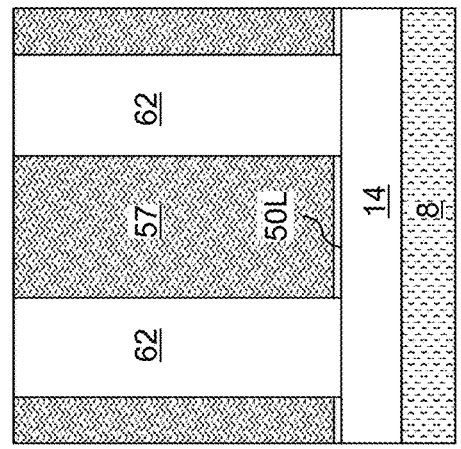
Figure 15A:
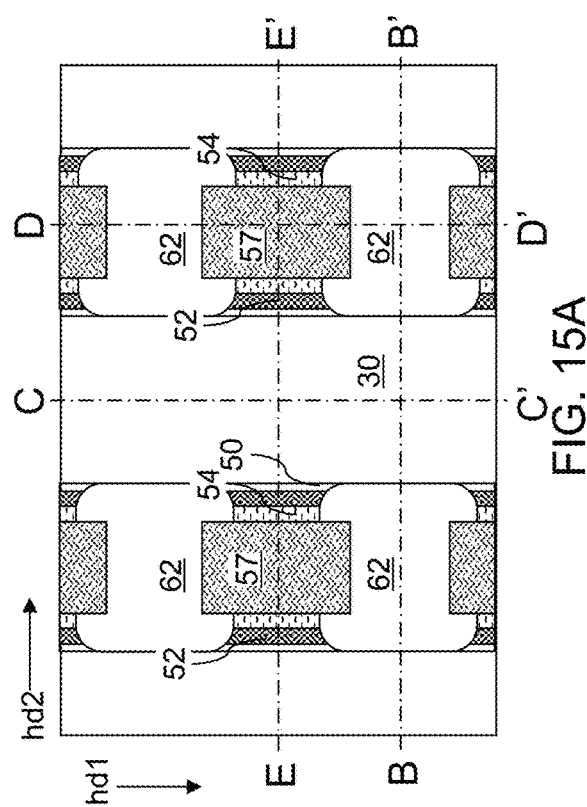
Figure 15B:
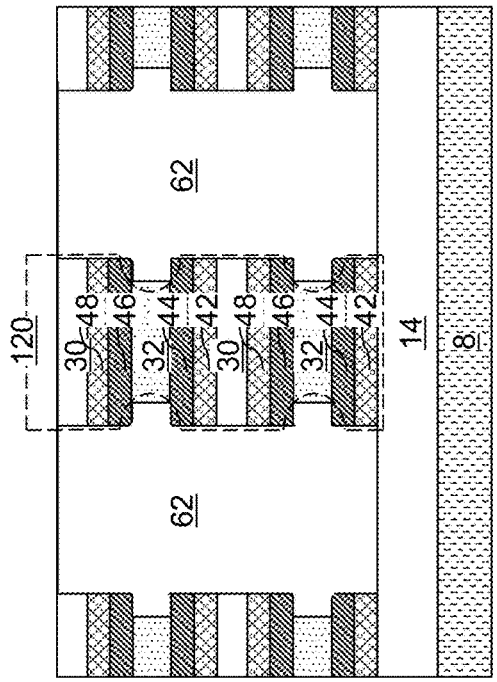
Figure 15E:
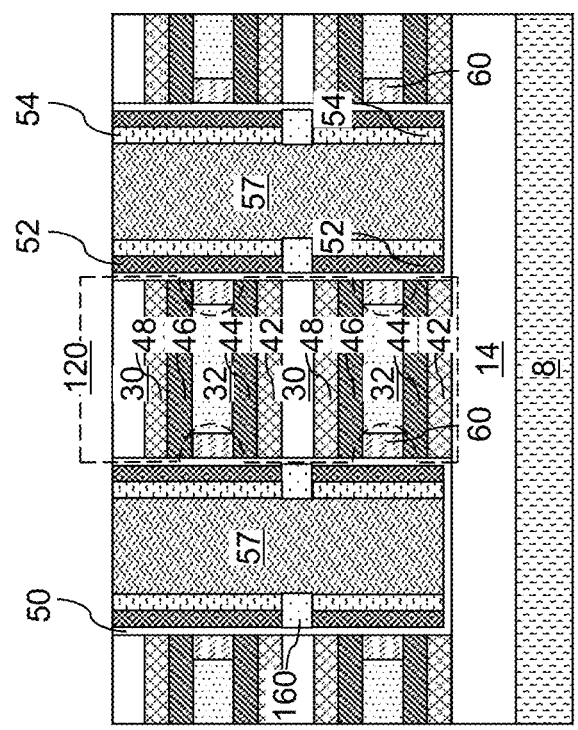
Figure 16C:
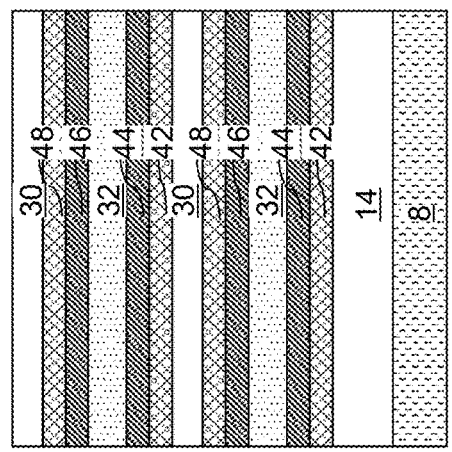
FIGS. 16A, 16B, 16C, 16D, and 16E are various views of the exemplary structure after formation of gate cavities according to an embodiment of the present disclosure.
Figure 16D:
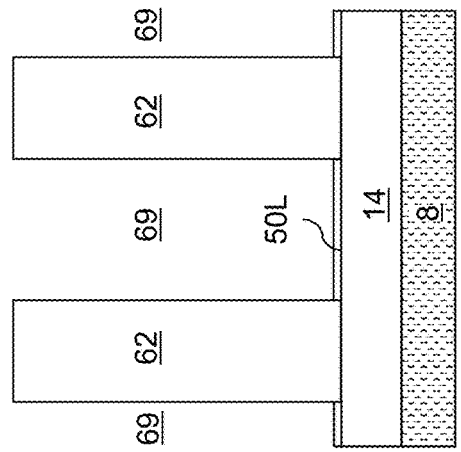
Figure 16A:
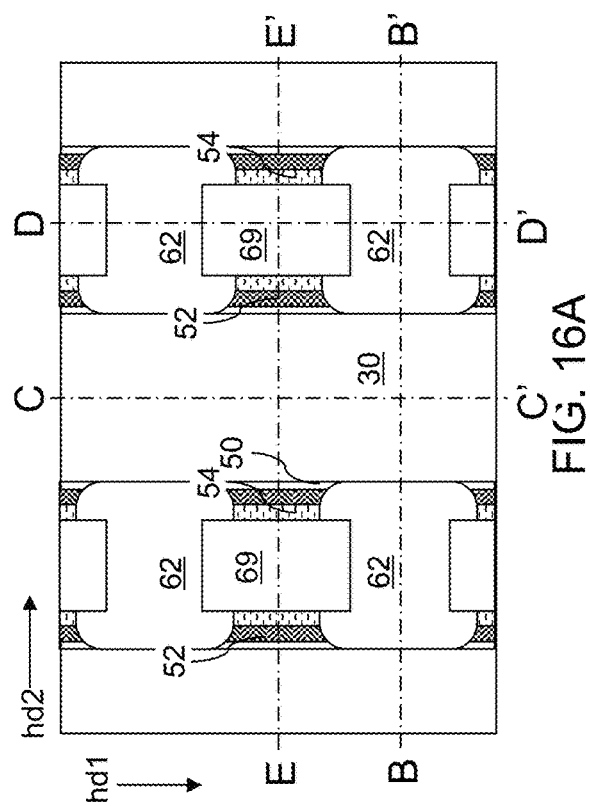
Figure 16B:
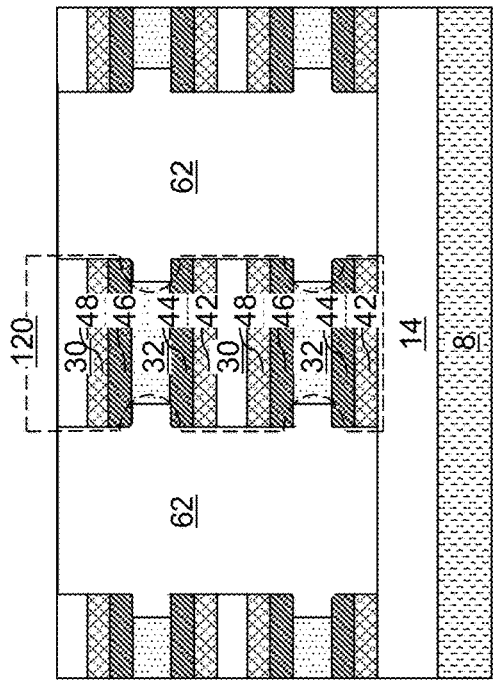
Figure 16E:
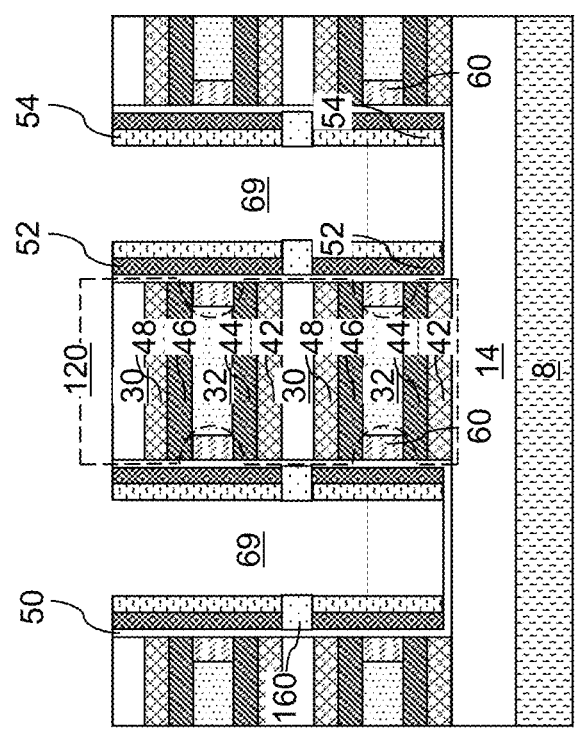
Figure 17C:
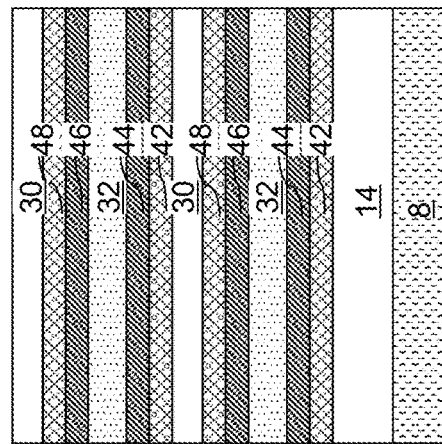
FIGS. 17A, 17B, 17C, 17D, and 17E are various views of the exemplary structure after formation of gate electrodes in the gate cavities according to an embodiment of the present disclosure.
Figure 17D:
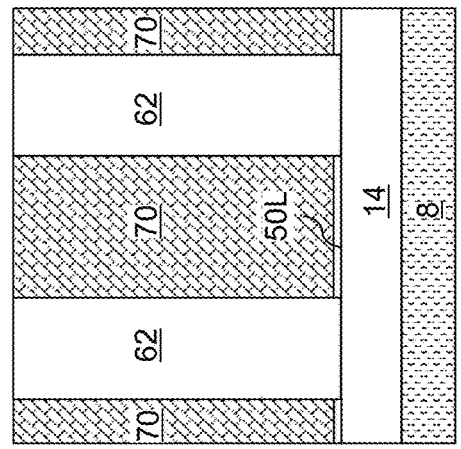
Figure 17A:
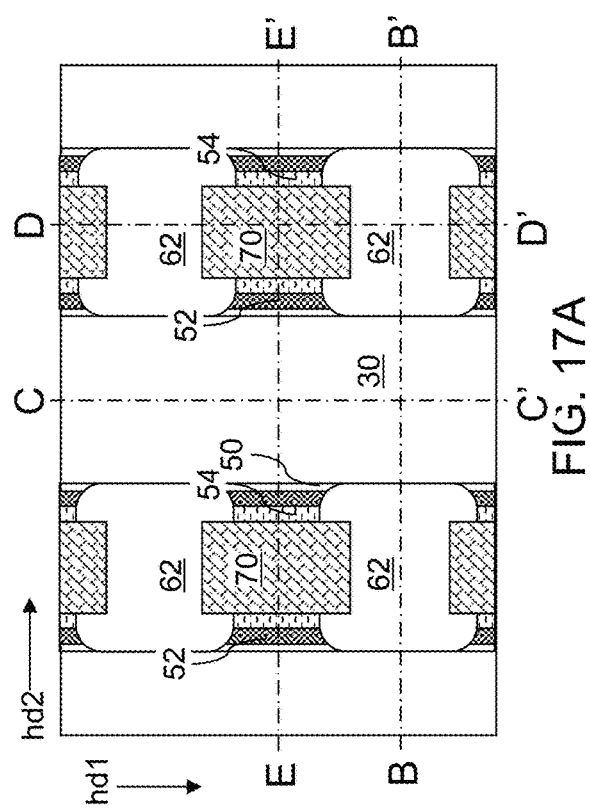
Figure 17B:
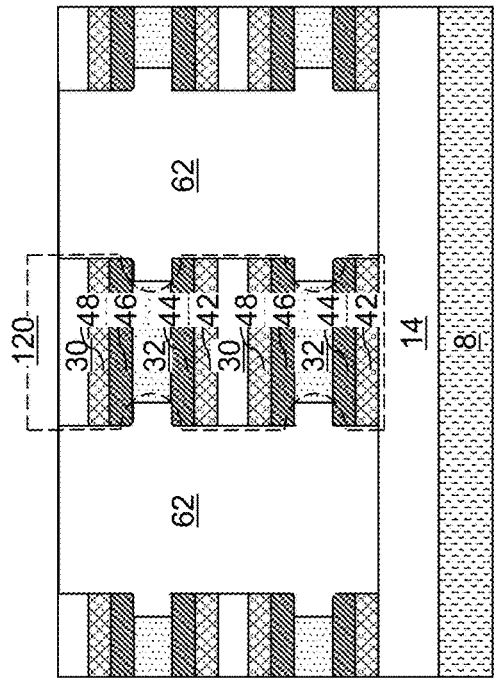
Figure 17E:
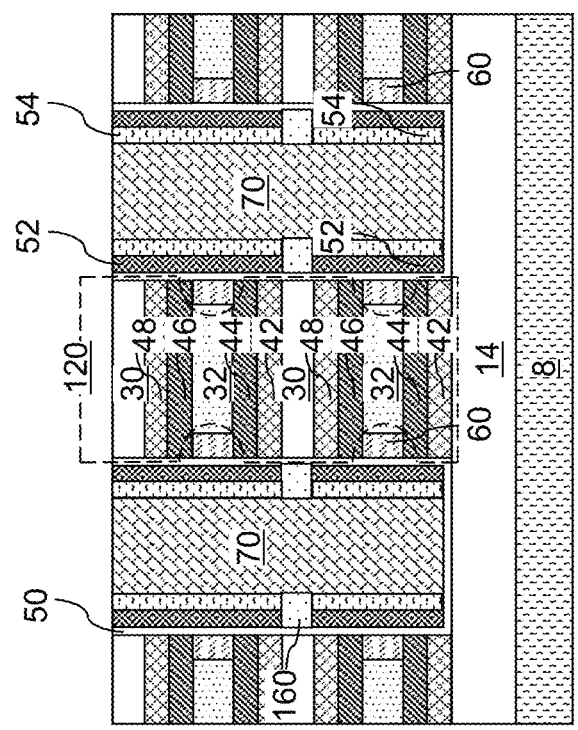
Figure 18A:
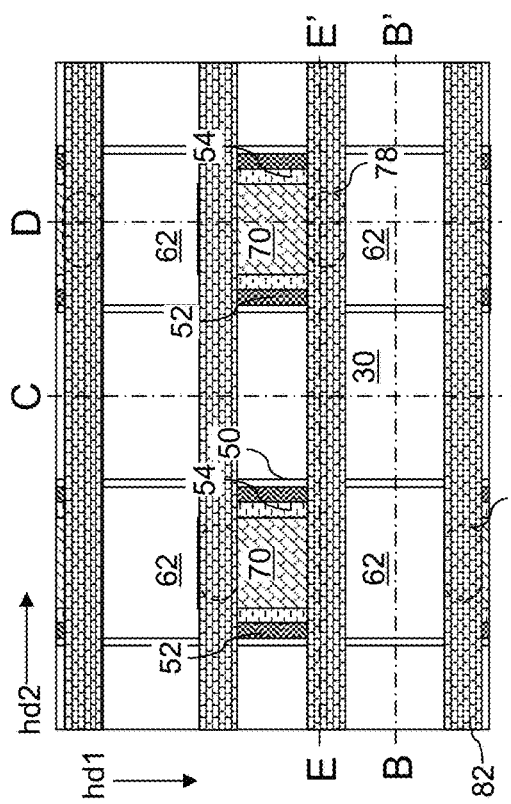
FIGS. 18A, 18B, 18C, 18D, and 18E are various views of the exemplary structure after formation gate contact via structures and global gate lines according to an embodiment of the present disclosure.
Figure 18C:
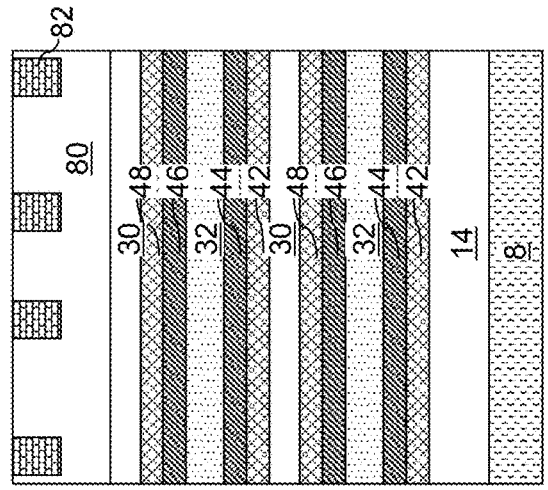
Figure 18B:
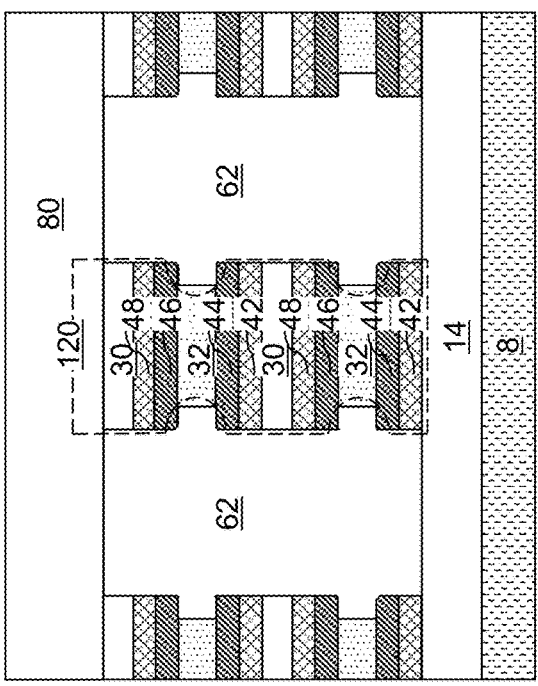
Figure 18D:
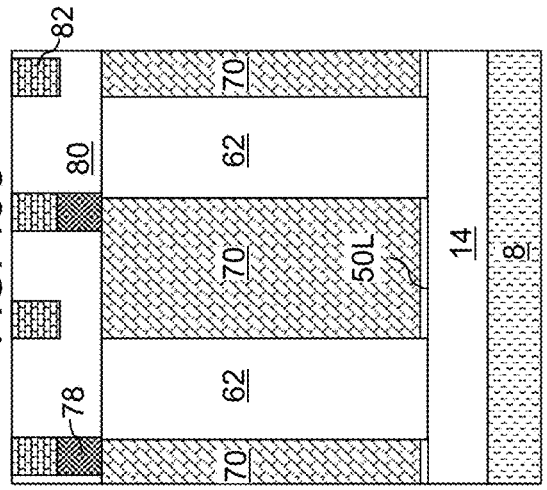
Figure 18E:
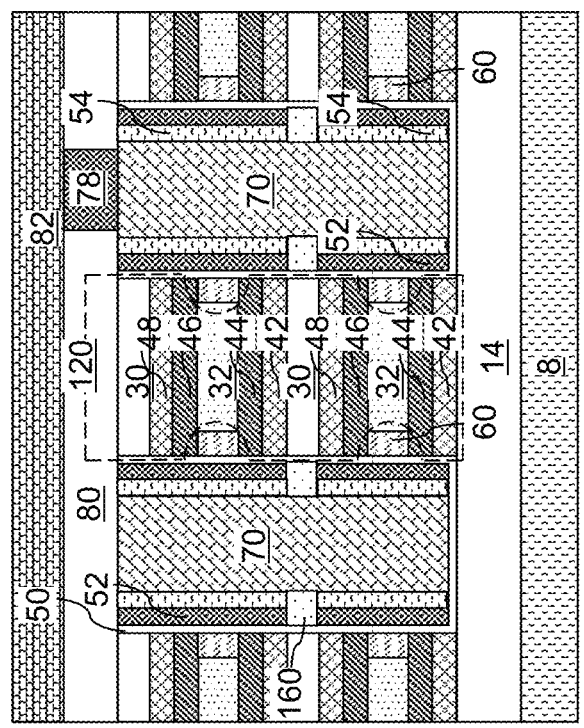

The in-process memory pillar structures (57, 50, 52, 54, 60) and the dielectric pillar structures 62 in each line trench 49 can alternate along the first horizontal direction hd1. Thus, two rows of vertical semiconductor channels 60 can be provided at each level of the channel-level insulating strips 32 within each line trench 49. Each dielectric pillar structure 62 can include at least one pair of laterally protruding portions that contacts a respective one of the channel-level insulating strips 32 in recesses from which the semiconductor channel material strip 60S material has been removed, as shown in FIG. 15B. Neighboring pairs of vertical semiconductor channels 60 within each row of vertical semiconductor channels 60 can be laterally spaced by a laterally protruding portion of a respective one of the dielectric pillar structures 62.

Referring to FIGS. 16A-16E, the material of the sacrificial fill material pillars 57 can be removed selective to the material of the ferroelectric dielectric layers 54, the material of the dielectric pillar structures 62, and the material of the inter-transistor-level insulating strips 30. For example, an isotropic etch process that etches the material of the sacrificial fill material pillars 57 selective to the material of the ferroelectric dielectric layers 54, the material of the dielectric pillar structures 62, and the material of the inter-transistor-level insulating strips 30 can be performed to remove the sacrificial fill material pillars 57. In an illustrative example, if the sacrificial fill material pillars 57 include a semiconductor material (such as amorphous silicon), then a wet etch process using hot trimethyl-2 hydroxyethyl ammonium hydroxide ("hot TMY") or tetramethyl ammonium hydroxide (TMAH) may be used to remove the sacrificial fill material pillars 57. Gate cavities 69 can be formed in volumes from which the sacrificial fill material pillars 57 are removed.

Referring to FIGS. 17A-17E, at least one conductive material can be deposited in the gate cavities 69 by a conformal deposition process such as a chemical vapor deposition process. The at least one conductive material can include a heavily doped semiconductor material (e.g., polysilicon), an elemental metal, an intermetallic alloy, a metallic nitride, a metallic carbide, a metal-semiconductor alloy (such as a metal silicide), an alloy thereof, and/or a layer stack thereof. For example, the at least one conductive material can include a layer stack of a titanium nitride liner and a tungsten fill material. Alternatively, the liner may be omitted. Excess portions of the at least one conductive material can be removed from above the horizontal plane including the topmost surfaces of the layer stack structure 120. Each remaining portion of the at least one conductive material that fills a gate cavity 69 constitutes a gate electrode (i.e., local word line) 70. Thus, each sacrificial fill material pillar 57 (which is a remaining portion of the sacrificial fill material rails 57R) is replaced with gate electrodes 70.

Each contiguous combination of a gate electrode 70, a gate dielectric 50, a pair of metallic liners 52, a pair of ferroelectric dielectric layers 54, and at least one pair of vertical semiconductor channels 60 constitutes a memory pillar structure (70, 50, 52, 54, 60). Thus, each in-process memory pillar structure (57, 50, 52, 54, 60) is replaced with a memory pillar structure (70, 50, 52, 54, 60). In one embodiment, each memory pillar structure (70, 50, 52, 54, 60) can comprise multiple pairs of vertical semiconductor channels 60 located at multiple levels of the channel-level insulating strips 32.

Each line trench 49 can be filled with a respective line trench fill structure. Each line trench fill structure can comprise a laterally-alternating sequence of memory pillar structures (70, 50, 52, 54,60) and dielectric pillar structures 62. Each of the memory pillar structures (70, 50, 52, 54, 60) comprises a gate electrode 70, a pair of ferroelectric dielectric layers 54, and at least one pair of vertical semiconductor channels 60 located at each level of the channel-level insulating strips 32.

Referring to FIGS. 18A-18E, at least one interconnect-level dielectric layer 80 can be deposited over the two-dimensional array of memory pillar structures (70, 50, 52, 54, 60). Various metal interconnect structures (78, 82) can be formed in the at least one interconnect-level dielectric layer 80. The various metal interconnect structures (78, 82) can include, for example, gate electrode connection via structures 78 contacting a respective one of the gate electrodes 70, and global gate lines (i.e., global word lines) 82 contacting a respective one, or a respective subset, of the gate electrode connection via structures 78. In one embodiment, the metallic source strips 42 and the metallic drain strips 48 can laterally extend along the first horizontal direction hd1, and the global gate lines 82 may laterally extend along the second horizontal direction hd2 which is perpendicular to the first horizontal direction hd1.

A three-dimensional array of ferroelectric memory elements can be formed. Each ferroelectric memory element comprises a portion of a ferroelectric dielectric layer 54 that is adjacent to a respective vertical semiconductor channel

60. The electrical current that passes through a selected vertical semiconductor channel 60 depends on the direction of polarization (i.e., the direction of the electrical dipole moment) within a proximal portion of an adjacent ferroelectric dielectric layer 54. Thus, a data bit can be programmed into each portion of the ferroelectric dielectric layers 54 that is adjacent to a respective one of the vertical semiconductor channels 60. The number of the channel-level insulating strips 32 within each layer stack structure 120 determines the number of ferroelectric memory elements that are vertically stacked.

Referring to FIGS. 19A-19E, an alternative configuration of the exemplary structure is illustrated, which can be derived from the exemplary structure of FIGS. 18A-18E by employing only one repetition of a unit layer sequence (42L, 44L, 32L, 46L, 48L, 30L) at the processing steps of FIGS. 1A-1C. In this case, a two-dimensional array of ferroelectric memory elements can be provided.

Figure 19C:
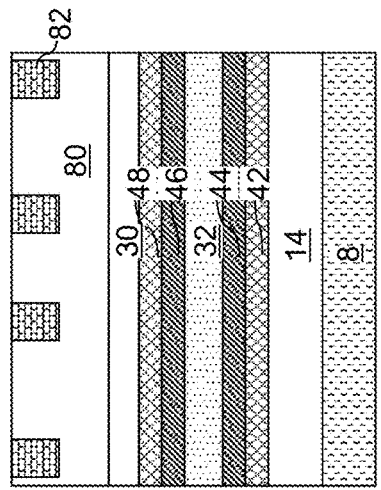
FIGS. 19A, 19B, 19C, 19D, and 19E are various views of an alternative configuration of the exemplary structure according to an embodiment of the present disclosure.
Figure 19D:
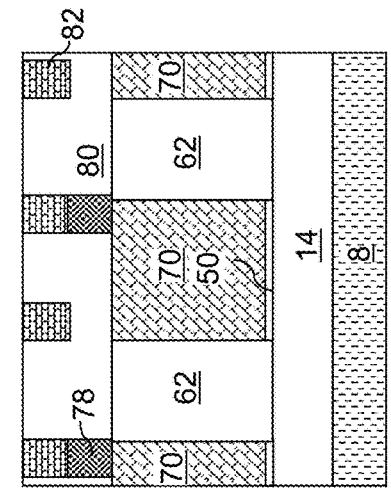
Figure 19A:
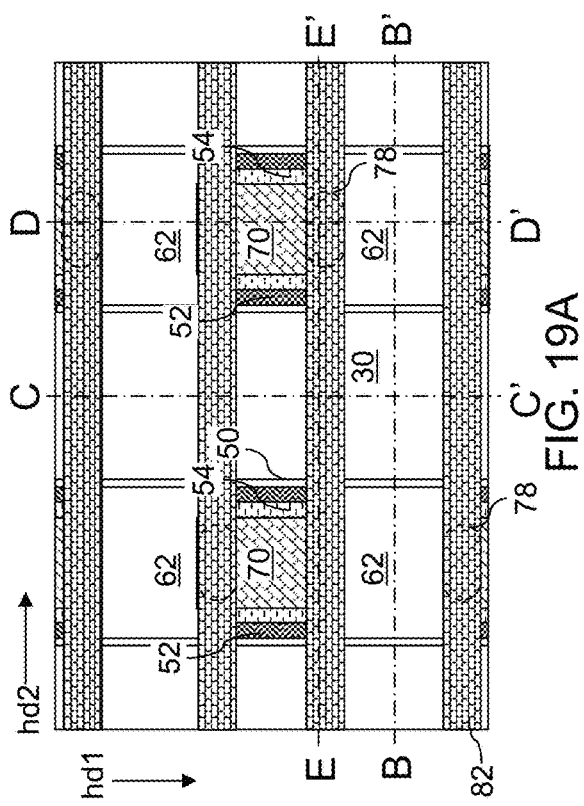
Figure 19B:
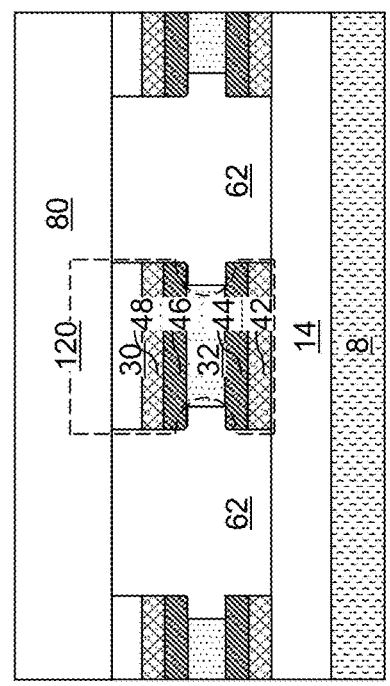
Figure 19F:
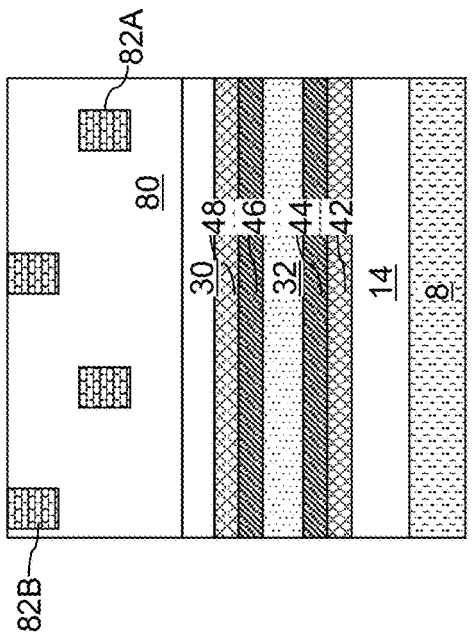
FIGS. 19F and 19G are side cross-sectional views of another alternative configuration of the exemplary structure according to another embodiment of the present disclosure.
Figure 19G:
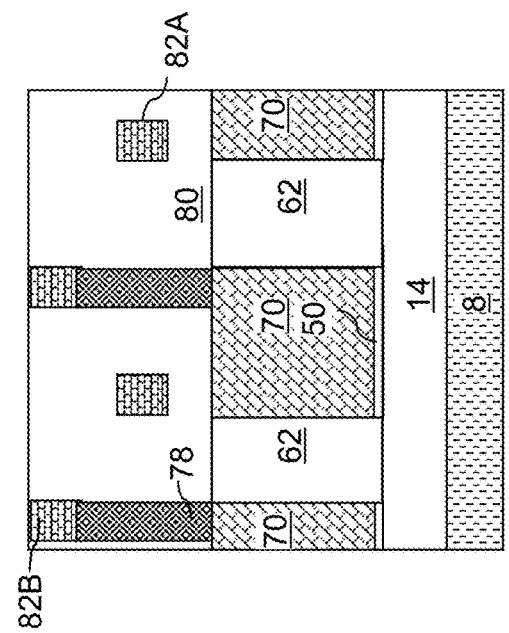
Figure 19E:
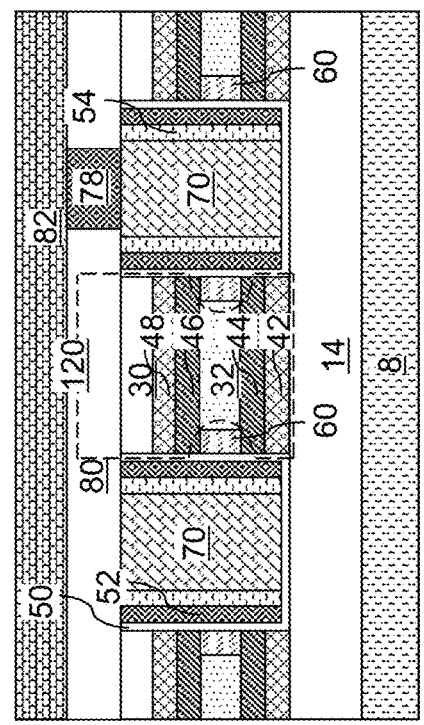

In another alternative embodiment, the global gate lines (i.e., global word lines) 82 may be formed in two different vertical levels, as shown in FIGS. 19F and 19G. FIGS. 19F and 19G correspond to the views shown in FIGS. 19C and 19D, respectively. For example, a first set 82A of global gate lines 82 may be formed at a first vertical level and a second set 82B of global gate lines 82 may be formed in a second vertical level located above the first vertical level. The global gate lines from the first set 82A may alternate with the global gate lines from the second set 82B. In this embodiment illustrated in FIG. 19G, the dielectric pillar structures 62 may be narrower than in the embodiment shown in FIG. 19D. This global gate line configuration may reduce the cell size and/or cell separation distance and increase the device density. Furthermore this global gate line configuration may also be used in the exemplary structure of FIGS. 18A-18E containing plural repetitions of a unit layer sequence.

Figure 20:
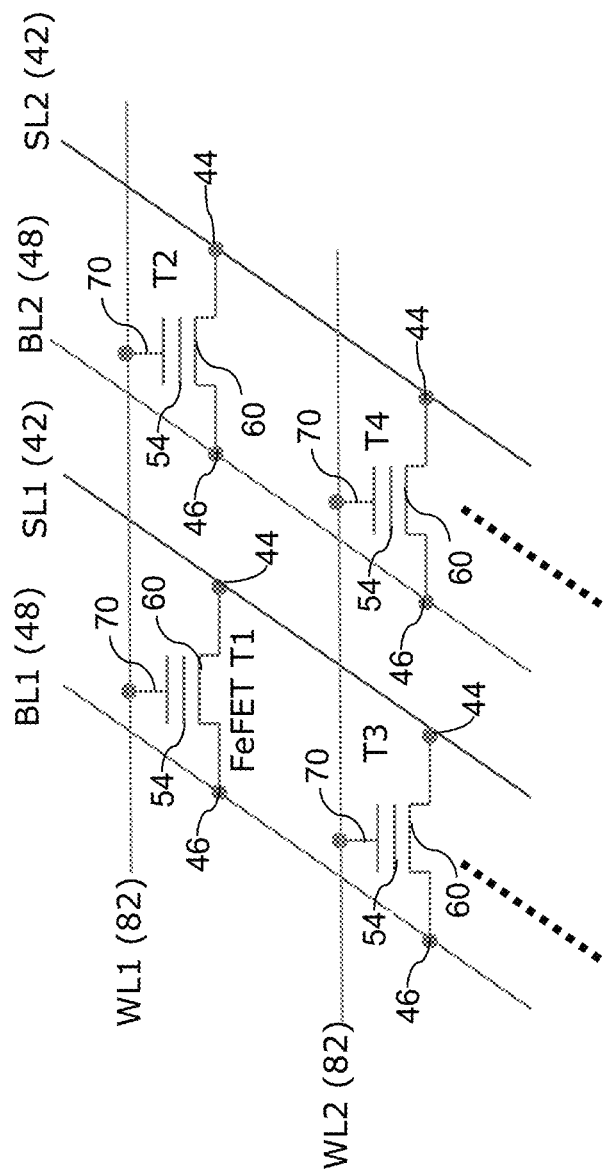
FIG. 20 is a circuit schematic for a portion of the exemplary structure of FIGS. 18A-18E.

Referring to FIG. 20, a circuit schematic is illustrated for a portion of the exemplary structure of FIGS. 18A-18E that includes a layer stack structure 120, two vertically-stacked rows of vertical semiconductor channels 60 located on one side of the layer stack structure 120, and a row of gate electrodes 70. Each contiguous combination of a metallic source strip 42 and a doped semiconductor source strip 44 constitutes a source line, which may be a first source line SL1 or a second source line SL2. Each contiguous combination of a metallic drain strip 48 and a doped semiconductor drain strip 46 constitutes a bit line, which may be a first bit line BL1 or a second bit line B21. Each gate electrode 70 constitutes a local word line (e.g., vertical local word line). Each global word line 82 may be a first word line WL1, a second word line WL2, etc. Each cross-point between a word line and a pair of a source line and a bit line includes a ferroelectric field effect transistor (FeFET), of which the on-current depends on the direction of polarization of a portion of a ferroelectric dielectric layer 54 contained therein. A first ferroelectric field effect transistor T1, a second ferroelectric field effect transistor T2, a third ferroelectric field effect transistor T3, and a fourth ferroelectric field effect transistor T4 are illustrated. Portions of the doped semiconductor source strip 44 located in each transistor function as the source region of the transistor, and portions of the doped semiconductor drain strip 46 located in each transistor function as the drain region of the transistor. The memory array may be operated as a NOR memory array.

Referring to all drawings and according to various embodiments of the present disclosure a semiconductor structure is provided. The semiconductor structure can comprise a three-dimensional array of ferroelectric memory cells or a two-dimensional array of ferroelectric memory cells. The semiconductor structure comprises: layer stack structures 120 laterally extending along a first horizontal direction hd1 and spaced apart from each other along a second horizontal direction hd2 by line trenches 49, wherein each of the layer stack structures 120 comprises at least one instance of a unit layer sequence (42, 44, 32, 46, 48, 30) that includes, from bottom to top or top to bottom, a doped semiconductor source strip 44, a channel-level insulating strip 32, and a doped semiconductor drain strip 46; and line trench fill structures (70, 50, 52, 54, 60, 62) located within a respective one of the line trenches 49, wherein each of the line trench fill structures (70, 50, 52, 54, 60, 62) comprises a laterally-alternating sequence of memory pillar structures (70, 50, 52, 54, 60) and dielectric pillar structures 62, and wherein each of the memory pillar structures (70, 50, 52, 54, 60) comprises a gate electrode 70, at least one pair of ferroelectric dielectric layers 54, and at least one pair of vertical semiconductor channels 60 located at each level of the channel-level insulating strips 32.

In one embodiment, each of the vertical semiconductor channels 60 contacts a respective one of the doped semiconductor source strips 44, a respective one of the doped semiconductor drain strips 46, and a respective one of the channel-level insulating strips 32.

In one embodiment, each of the channel-level insulating strips 32 contacts two rows of vertical semiconductor channels 60 arranged along the first horizontal direction hd1; and neighboring pairs of vertical semiconductor channels 60 within each row of vertical semiconductor channels 60 are laterally spaced by a laterally protruding portion of a respective one of the dielectric pillar structures 62.

In one embodiment, the vertical semiconductor channels 60 have a doping of a first conductivity type; and the doped semiconductor source strips 44 and the doped semiconductor drain strips 46 have a doping of a second conductivity type that is opposite to the first conductivity type.

In one embodiment, each of the ferroelectric dielectric layers 54 has a first straight sidewall that vertically extends through multiple levels of the layer stack structures 120 and contacts a respective one of the gate electrodes 70, and a second straight sidewall that is parallel to the first straight sidewall and faces a respective one of the layer stack structures 120.

In one embodiment, each of the vertical semiconductor channels 60 comprises a respective sidewall that is vertically coincident with a sidewall of one of the doped semiconductor source strips 44 and with a sidewall of one of the doped semiconductor drain strips 46. In one embodiment, each of the channel-level insulating strips 32 contacts a respective one of the doped semiconductor source strips 44 and a respective one of the doped semiconductor drain strips 46, and has a width along the second horizontal direction hd2 that is less than a width of the respective one of the doped semiconductor source strips 44 along the second horizontal direction hd2.

In one embodiment, each of the memory pillar structures (70, 50, 52, 54, 60) also comprises at least one pair of metallic liners 52 contacting the at least one pair of ferroelectric dielectric layers 54. In one embodiment, each of the memory pillar structures (70, 50, 52, 54, 60) comprises a pair of vertically-extending gate dielectric portions that contacts the at least one pair of metallic liners 52; and each of the vertically-extending gate dielectric portions contacts a sidewall of a respective one of the layer stack structures 120.

In one embodiment, the unit layer sequence (42, 44, 32, 46, 48, 30) further comprises: a metallic source strip 42 that contacts the doped semiconductor source strip 44; and a metallic drain strip 48 that contacts the doped semiconductor drain strip 46. In one embodiment, each of the vertically-extending gate dielectric portions contacts each metallic source strip 42, each doped semiconductor source strip 44, each doped semiconductor drain strip 46, and each metallic drain strip 48 within the respective one of the layer stack structures 120, and does not directly contact any channel-level insulating strip 32 within the respective one of the layer stack structures 120.

In one embodiment, each of the layer stack structures 120 comprises multiple instances of the unit layer sequence (42, 44, 32, 46, 48, 30); and the multiple instances of the unit layer sequence (42, 44, 32, 46, 48, 30) that are vertically stacked.

In one embodiment, each of the ferroelectric dielectric layers 54 comprises a pair of laterally-concave and vertically-straight sidewalls that contact a pair of dielectric pillar structures 62 of the dielectric pillar structures 62.

In one embodiment, one of the gate electrodes 70 and one of the dielectric pillar structures 62 (which may be any contacting pair of a gate electrode 70 and a dielectric pillar structure 62) has a continuous vertical interface that comprises: a first vertical interface segment that is perpendicular to the first horizontal direction hd2; and a pair of second vertical interface segments that are perpendicular to the second horizontal direction hd2 and adjoined to a respective vertical edge of the first vertical interface segment.

The various embodiments of the present disclosure can be employed to provide a three-dimensional cross-point array of compact ferroelectric field effect transistors or a two-dimensional cross-point array of compact ferroelectric field effect transistors. Each ferroelectric field effect transistor has a small cell size and can be used as a ferroelectric memory cell that can store a data bit in the form of the direction of polarization of a respective portion of a ferroelectric dielectric layer 54.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
    layer stack structures laterally extending along a first horizontal direction and spaced apart from each other along a second horizontal direction by line trenches, wherein each of the layer stack structures comprises at least one instance of a unit layer sequence that includes, from bottom to top or top to bottom, a doped semiconductor source strip, a channel-level insulating strip, and a doped semiconductor drain strip; and
    line trench fill structures located within a respective one of the line trenches, wherein each of the line trench fill structures comprises a laterally-alternating sequence of memory pillar structures and dielectric pillar structures, and wherein each of the memory pillar structures comprises a gate electrode, at least one pair of ferroelectric dielectric layers, and at least one pair of vertical semiconductor channels, wherein each pair of vertical semiconductor channels of the at least one pair of vertical semiconductor channels is located at a level of the channel-level insulating strip of a respective one of the at least one instance of the unit layer sequence.

2. The semiconductor structure of claim 1, wherein each of the vertical semiconductor channels contacts a respective one of the doped semiconductor source strips, a respective one of the doped semiconductor drain strips, and a respective one of the channel-level insulating strips.

3. The semiconductor structure of claim 1, wherein:
    each of the channel-level insulating strips contacts two rows of vertical semiconductor channels arranged along the first horizontal direction, wherein each vertical semiconductor channel of a respective row of vertical semiconductor channels is located in a respective memory pillar structure of the laterally-alternating sequence of memory pillar structures and dielectric pillar structures; and
    neighboring pairs of vertical semiconductor channels within each row of vertical semiconductor channels are laterally spaced by a laterally protruding portion of a respective one of the dielectric pillar structures.

4. The semiconductor structure of claim 1, wherein:
    the doped semiconductor source strips and the doped semiconductor drain strips have a doping of a first conductivity type; and
    the vertical semiconductor channels have a doping of a second conductivity type that is opposite to the first conductivity type.

5. The semiconductor structure of claim 1, wherein each of the ferroelectric dielectric layers has a first straight sidewall that vertically extends through multiple levels of the layer stack structures and contacts a respective one of the gate electrodes, and a second straight sidewall that is parallel to the first straight sidewall and faces a respective one of the layer stack structures.

6. The semiconductor structure of claim 1, wherein each of the vertical semiconductor channels comprises a respective sidewall that is vertically coincident with a sidewall of one of the doped semiconductor source strips and with a sidewall of one of the doped semiconductor drain strips.

7. The semiconductor structure of claim 6, wherein each of the channel-level insulating strips contacts a doped semiconductor source strip and a doped semiconductor drain strip, and has a width along the second horizontal direction that is less than a width of the doped semiconductor source strip that contacts the channel-level insulating strip along the second horizontal direction.

8. The semiconductor structure of claim 1, wherein each of the memory pillar structures further comprises at least one pair of metallic liners contacting the at least one pair of ferroelectric dielectric layers.

9. The semiconductor structure of claim 8, wherein:
    each of the memory pillar structures comprises a pair of vertically-extending gate dielectric portions that contacts the at least one pair of metallic liners; and each of the vertically-extending gate dielectric portions contacts a sidewall of a respective one of the layer stack structures.

10. The semiconductor structure of claim 9, wherein the unit layer sequence further comprises:
   a metallic source strip that contacts the doped semiconductor source strip; and
   a metallic drain strip that contacts the doped semiconductor drain strip.

11. The semiconductor structure of claim 10, wherein each of the vertically-extending gate dielectric portions contacts each metallic source strip, each doped semiconductor source strip, each doped semiconductor drain strip, and each metallic drain strip within the respective one of the layer stack structures, and does not directly contact any channel-level insulating strip within the respective one of the layer stack structures.

12. The semiconductor structure of claim 1, wherein the at least one instance of the unit layer sequence of each of the layer stack structures comprises multiple instances of the unit layer sequence that are vertically stacked.

13. The semiconductor structure of claim 1, wherein each of the ferroelectric dielectric layers comprises a pair of laterally-concave and vertically-straight sidewalls that contact a pair of dielectric pillar structures of the dielectric pillar structures.

14. The semiconductor structure of claim 1, wherein a boundary of one of the gate electrodes and one of the dielectric pillar structures has a continuous vertical interface, the continuous vertical interface comprising:
   a first vertical interface segment that is perpendicular to the first horizontal direction; and
   a pair of second vertical interface segments that are perpendicular to the second horizontal direction and adjoined to a respective vertical edge of the first vertical interface segment.

* * * * *